United States Patent
Mori et al.

[19]

[11] Patent Number: 5,574,308
[45] Date of Patent: Nov. 12, 1996

[54] SEMICONDUCTOR DEVICE AND ITS MANUFACTURING METHOD

[75] Inventors: Toshihiko Mori; Yoshiki Sakuma, both of Kawasaki, Japan

[73] Assignee: Fujitsu Limited, Kanagawa, Japan

[21] Appl. No.: 488,057

[22] Filed: Jun. 7, 1995

Related U.S. Application Data

[62] Division of Ser. No. 162,703, Dec. 7, 1993, Pat. No. 5,438,018.

[30]    Foreign Application Priority Data

Dec. 7, 1992   [JP]   Japan ................................. 4-326944

[51] Int. Cl.⁶ .................................................. H01L 29/06
[52] U.S. Cl. ........................ 257/618; 257/623; 257/506; 257/74; 257/197
[58] Field of Search ........................... 257/618, 623, 257/506, 25, 30, 74, 197, 566, 586

[56]                References Cited

U.S. PATENT DOCUMENTS

| | | | |
|---|---|---|---|
| 4,566,025 | 1/1986 | Jastrzebski et al. | 257/369 |
| 4,774,205 | 9/1988 | Choi et al. | 437/59 |
| 4,837,175 | 6/1989 | Caviello | 437/24 |
| 5,045,494 | 9/1991 | Choi et al. | 437/60 |
| 5,270,245 | 12/1993 | Gaw et al. | 437/127 |

FOREIGN PATENT DOCUMENTS 59-134889   8/1984   Japan .

OTHER PUBLICATIONS

Jastrzebski, L. "Soi by CVD: Epitaxial Lateral Overgrowth (ELO) Process–Review", Journal of Crystal Growth, vol. 63, (1983) pp. 493–526.

*Primary Examiner*—Mark V. Prenty
*Attorney, Agent, or Firm*—Nikaido, Marmelstein, Murray & Oram LLP

[57]                ABSTRACT

A selective growth mask having a plurality of openings is formed on a semiconductor substrate. Desired epitaxially grown regions are formed on the openings by controlling the upward epitaxial growth from the openings. Two resonance tunnel barrier diodes are formed on respective separated two epitaxially grown regions and connected together. Thereafter, a tunnel barrier diode is formed on the connected two resonance tunnel barrier diodes to form a composite functional element having an SRAM function. A number of composite functional elements can be integrally formed on a semiconductor substrate by selective growth and a small number of fine processes.

15 Claims, 32 Drawing Sheets

5,574,308

SEMICONDUCTOR DEVICE AND ITS MANUFACTURING METHOD

This is a division of application Ser. No. 08/162,703, filed Dec. 7, 1993 now U.S. Pat. No. 5,438,018.

BACKGROUND OF THE INVENTION a) Field of the Invention

The present invention relates to a semiconductor device and its manufacturing method, and more particularly to a semiconductor device and its manufacturing method, using selective growth.

b) Description of the Related Art

High speed operation and high integration of semiconductor devices are strongly requested. To meet such requests, miniaturization as well as high integration of semiconductor elements is necessary. If the degree of miniaturization is less than integration, the area of a chip increases, posing a problem of a delay of signal transmission time and the like. For the miniaturization of semiconductor elements, fine processes such as reactive ion etching (RIE) are used.

The surface of semiconductor subjected to the fine process such as RIE, however, may have damages. The damaged semiconductor surface deteriorates the characteristics of semiconductor crystal and lowers the performance of a semiconductor device.

If many fine processes are executed to miniaturize semiconductor elements, there is a limit of miniaturization from the consideration of the performance of semiconductor elements.

It is effective for the miniaturization of semiconductor devices to simplify the structure of electronic functional elements capable of performing predetermined circuit functions. For example, if the structure of a static random access memory (SRAM) generally made of six transistors can be simplified, the semiconductor device providing predetermined circuit functions can be made compact.

As such functional elements having simplified structures and providing predetermined circuit functions, there are known double-emitter hot electron transistors (DEHET), double-emitter hetero bipolar transistors (DEHET), and the like.

In the case of a double-emitter resonance hot electron transistor (DERHET), electron levels in the resonance tunnel diode structures are quantized and the transistor shows the negative differential resistance characteristic.

In DERHET, two voltage values are stable relative to a same current value. Therefore, two stable states are generated when predetermined voltages are applied to double-emitters. An SRAM cell can be made by using this function.

As described above, use of a fine process such as RIE results in damages on the surface of semiconductor and limits the performance of a semiconductor device. It has been long desired therefore to manufacture a semiconductor device having a miniaturized structure by using a fine process as less as possible.

If semiconductor elements having such a miniaturized structure can provide a predetermined circuit function with a simplified circuit structure, it can greatly contribute to compacting a semiconductor device.

SUMMARY OF THE INVENTION

It is an object of the present invention to provide a semiconductor device capable of alleviating the need of a fine process.

It is another object of the present invention to provide a method of manufacturing a semiconductor device capable of alleviating the need of a fine process.

It is another object of the present invention to miniaturize a semiconductor device capable of providing a predetermined circuit function by using a simplified structure.

According to one aspect of the present invention, there is provided a semiconductor device having: a single crystal semiconductor substrate; a first insulating region formed on the single crystal semiconductor substrate; an opening defining member for defining a pair of openings, the pair of openings exposing the surface of the single crystal semiconductor substrate on both the sides of the first insulating region, the opening defining member having a function of regulating the growth of semiconductor crystal and having a pair of conductive regions at least near the pair of openings; a pair of first semiconductor single crystal structures separated from each other, the pair of first semiconductor single crystal structures contacting the surface of the single crystal semiconductor substrate in the pair of openings, extending on the surface of the opening defining member, and being electrically connected to the pair of first conductive regions; a second conductive region of single crystal material continuously formed on the pair of first semiconductor single crystal structures; and a second semiconductor single crystal structure formed on the second conductive region.

According to another aspect of the present invention, there is provided a method of manufacturing a semiconductor device including: a growth mask forming step of forming a growth mask for forming an opening defining member on the surface of a single crystal semiconductor substrate, the opening defining member defining a pair of openings on both the sides of a first insulating region and having a pair of first conductive regions at least on partial areas on both the sides of the pair of openings; a first epitaxial growth step of epitaxially growing a pair of first semiconductor single crystal structures separated from each other and electrically connected to the pair of first conductive regions, the pair of first semiconductor single crystal structures growing upward from the surface of the single crystal semiconductor substrate exposed by the pair of openings and growing laterally and outwardly at least on the surface of the opening defining member near the openings; a second epitaxial growth step of epitaxially growing conductive regions on the pair of semiconductor single crystal structures, the conductive regions being electrically connected above the first insulating region to form a second conductive region; and a third epitaxial growth step of epitaxially growing a second semiconductor single crystal structure on the second conductive region.

Semiconductor crystal is selectively grown by using a pair of openings separated by a first insulating region, and a pair of first single crystal structures of a desired shape can be formed. A need of a fine process is alleviated by using selective growth.

The pair of first single crystal structures are electrically connected above the first insulating region, and a second semiconductor single crystal structure is epitaxially grown on the combined pair of first single crystal structures. In this manner, a semiconductor functional element having a predetermined circuit function can be formed with less need of a fine process.

As described above, a semiconductor structure is selectively formed by selectively exposing the surface of a semiconductor substrate. It is therefore possible to realize a semiconductor device with less need of a fine process.

A double-emitter type transistor may be formed in an inverted configuration. In this case, a desired circuit function can be realized with a simple structure.

DETAILED DESCRIPTION OF THE PREFERRED EMBODIMENTS

Figure 1:
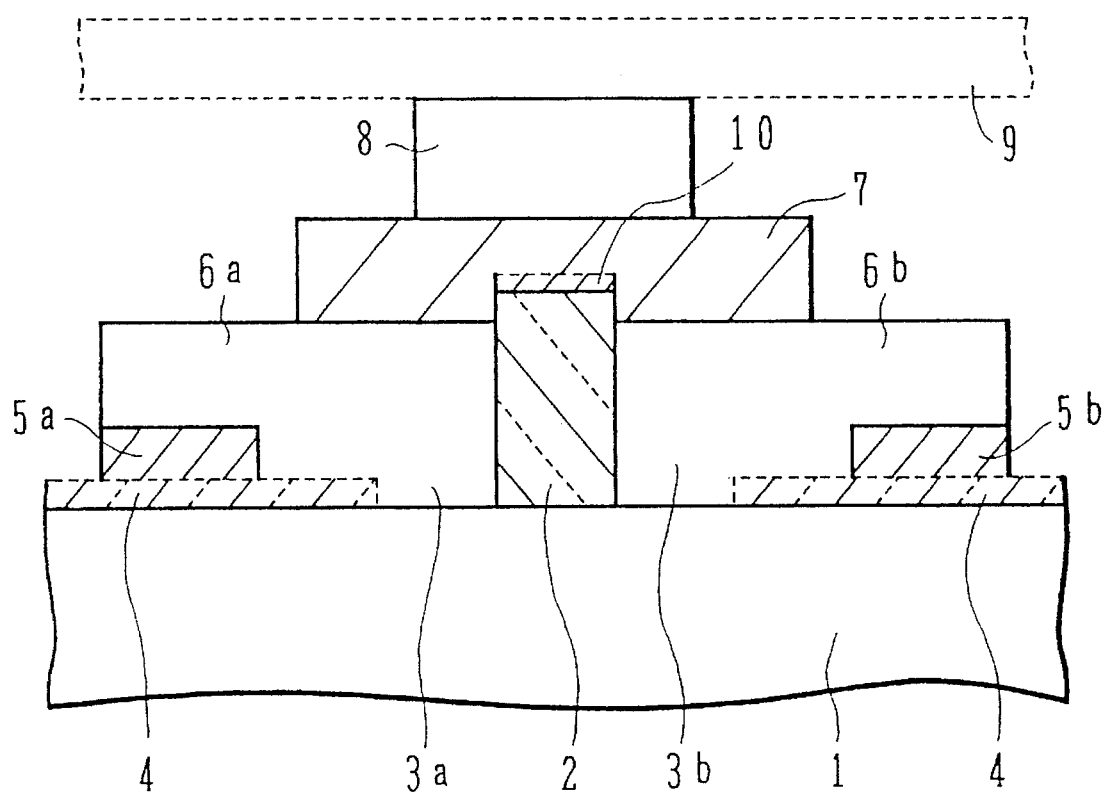
FIG. 1 is a schematic cross sectional view showing the fundamental structure of a semiconductor device according to the present invention.

FIG. 1 shows the fundamental structure of a semiconductor device according to an embodiment of the invention. On the surface of a single crystal semiconductor substrate 1, a first insulating region 2 is formed. On both the sides of the first insulating region 2, opening defining members 4, 5a, and 4, 5b are arranged to define openings 3a and 3b between the first insulating region 2 and the opening defining members. The opening defining members cooperatively with the first insulating region 2 provide a function of regulating the growth of semiconductor crystal.

First semiconductor single crystal structures 6a and 6b are selectively grown therefore on the surface of the single crystal semiconductor substrate 1, and not on the surface of the opening defining members 4 and 5.

However, when the grown semiconductor single crystal reaches the surface level of the opening defining members 4 and 5, the lateral growth of semiconductor single crystal starts on the surface of the opening defining members 4 and 5. The opening defining members have at least a pair of first conductive regions 5a and 5b.

When the first semiconductor single crystal structures 6a and 6b grow laterally and contact the first conductive regions 5a and 5b, there is formed electrical contacts between the first semiconductor single crystal structures 6a and 6b and first conductive regions 5a and 5b. The two first semiconductor single crystal structures 6a and 6b are electrically isolated by the first insulating region 2.

Second conductive regions 7 are epitaxially grown on the surfaces of the pair of first semiconductor single crystal structures 6a and 6b. The second conductive regions 7 are connected together on the top surface of the first insulating region 2 to form an integral conductive region 7.

A second semiconductor single crystal structure 8 is epitaxially grown on the surface of the second conductive region 7.

In this manner, the pair of first semiconductor single crystal structures 6a and 6b is electrically connected via the second conductive region 7 to the second semiconductor single crystal structure 8. A third conductive region 9 may be formed on the surface of the second semiconductor single crystal structure 8.

As the opening defining members, only the first conductive regions 5a and 5b may be used, or both the insulating regions 4 formed on the single crystal semiconductor substrate 1 and the pair of first conductive regions 5a and 5b may be used.

A fourth conductive region 10 may be formed on the top surface of the first insulating region 2. In this case, the second conductive regions 7 are laterally grown on the top surface of the fourth conductive region 10 by controlling the growth conditions of the second conductive regions 7, to provide an electrical contact between the second conductive region 7 and fourth conductive region 10.

The above-described semiconductor device can be manufactured efficiently by a selective epitaxial growth technique by controlling the growth conditions of semiconductor single crystal structures. For example, the side walls of the first semiconductor single crystal structures 6a and 6b, second conductive region 7, and second semiconductor single crystal structures 8, may be made to be a normal taper side wall or an inverted tape side wall. The pair of first semiconductor single crystal structures 6a and 6b can be electrically isolated by making the side walls of the crystal structures be a taper side wall.

A double-emitter type hot electron transistor or the like may be formed by using a pair of resonance tunnel diode structures as the first semiconductor single crystal structures 6a and 6b. In this case, the second semiconductor single crystal structure 8 is preferably a tunnel barrier diode structure.

A double-emitter type junction bipolar transistor may be formed by using the pair of first semiconductor single crystal structures 6a and 6b as a double-emitter, by using the second conductive region 7 as a base region coupled to the double-emitter, and by using the second semiconductor single crystal structure as a collector region. A hetero junction bipolar transistor may also be formed.

A double-emitter type hot electron transistor has a composite function and can operate singularly as an SRAM which is generally formed by six transistors. A double-emitter type junction bipolar transistor can also be used effectively as a constituent element of a memory. It is obvious for those skilled in the art that other semiconductor elements may also be formed.

More particular embodiments of a semiconductor device will be described below.

FIGS. 2A to 6B illustrate a method of manufacturing a double-emitter type resonance hot electron transistor (RHET) according to an embodiment of the invention.

Figure 2A:
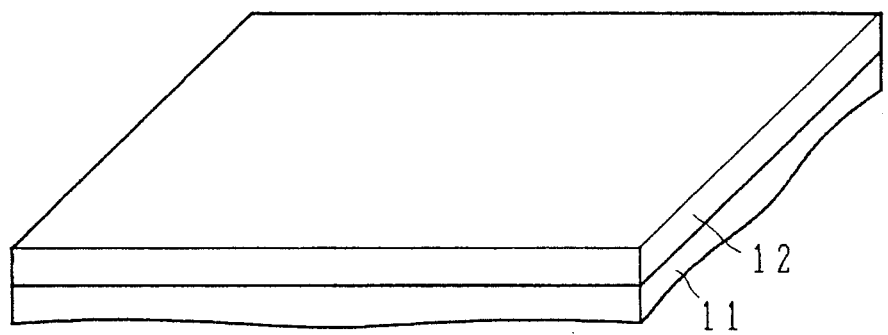
FIGS. 2A–2C, 3A–3C, 4A–4C, 5A–5C, 6A, and 6B are perspective views illustrating the semiconductor device manufacturing method according to a first embodiment of the invention.

As shown in FIG. 2A, on the surface of a semiinsulating InP semiconductor substrate 11 having the (1 0 0) plane, grown by a liquid encapsulated Czochralski method, and doped with Fe, an $SiO_2$ insulating film 12 is deposited to a thickness of about 1500 angstroms by plasma chemical vapor deposition (CVD).

For the plasma CVD, the substrate temperature was set to about 300° C., and a mixed gas of $SiH_4+N_2O+N_2$ was introduced. The insulating film 12 may be made of $Si_3N_4$, SiON, AlN, and the like, instead of $SiO_2$.

Figure 2B:
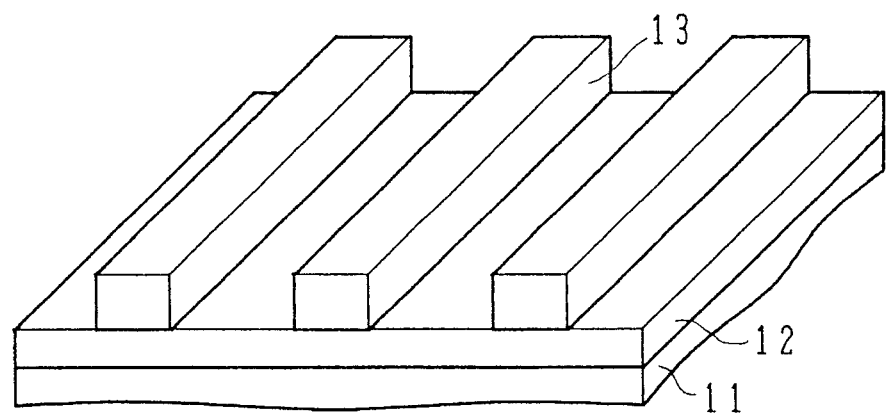

As shown in FIG. 2B, a resist layer is coated on the surface of the insulating film 12, and a resist pattern 13 is formed in the <1–1 0> direction.

Figure 2C:
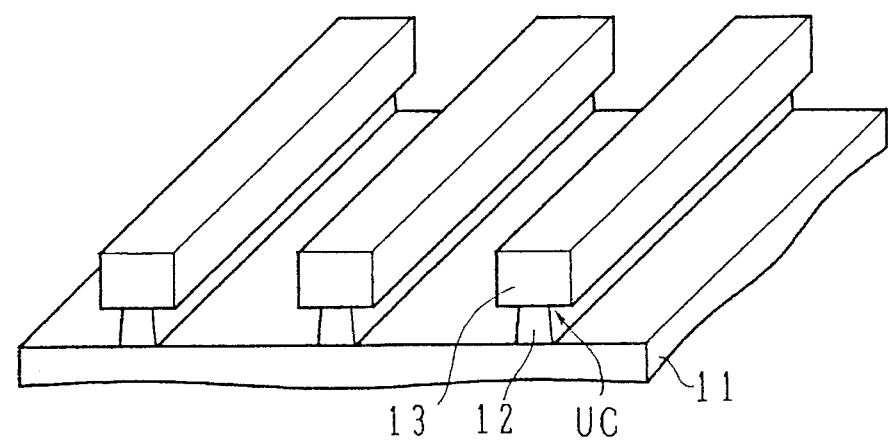

As shown in FIG. 2C, using the resist pattern 13 as an etching mask, the underlie insulating film 12 is etched. For the etching, a mixed gas of $CHF_3+CF_4$ was introduced, and wet etching was performed using a mixed solution of HF, $NH_4F$, and $H_2O$ as the etchant to form an undercut UC on both the side walls of the resist pattern 13.

Figure 3A:
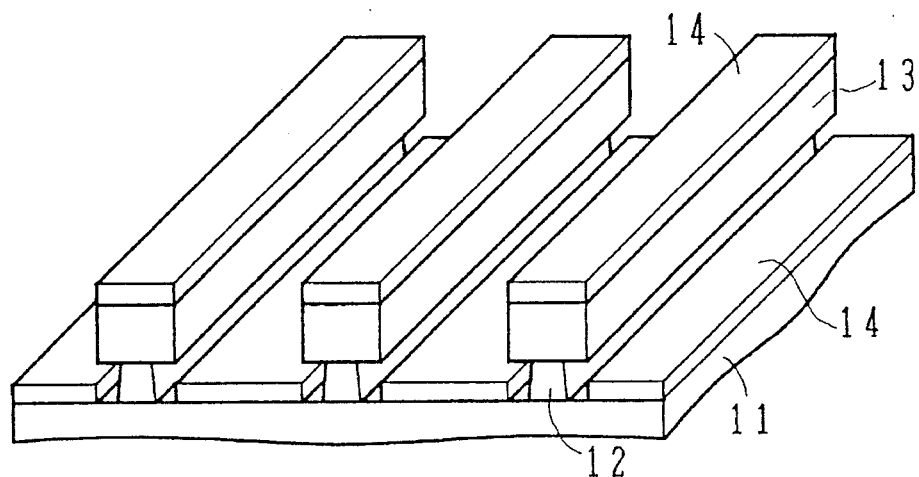

As shown in FIG. 3A, a metal film 14 of WSi is deposited to a thickness of about 500 angstroms by Ar-sputtering. The deposited metal film 14 covers the top surface of the resist pattern 13 and the surface of the semiconductor substrate 11 not shielded by the resist pattern 13.

Since the undercut is formed under the resist pattern 13, a gap is formed between the insulating film 12 and the metal film 14 on the surface of the semiconductor substrate 11. This gap forms an opening for exposing the surface of the semiconductor substrate 11.

Figure 3B:
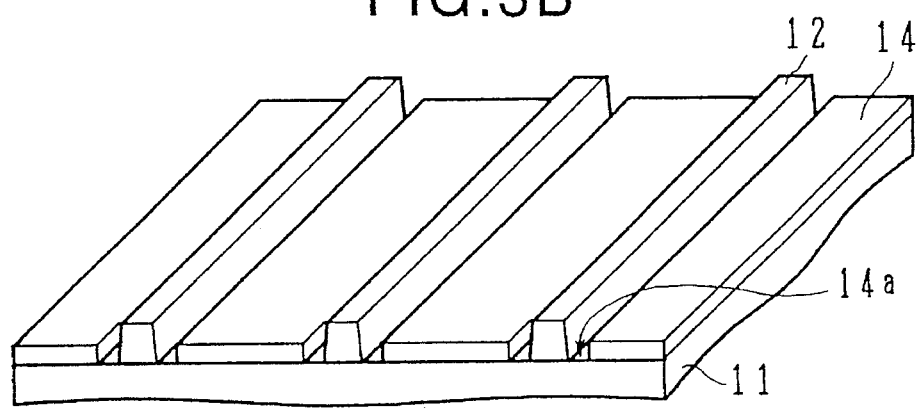

As shown in FIG. 3B, the metal film 14 on the resist pattern 13 is lifted off by removing the resist pattern 13. The metal film 14 on the surface of the semiconductor substrate 11 is left unremoved. An opening 14a is formed extending in the <1–1 0> direction between the metal film 14 and the insulating film 12. The lift-off process may be performed by boiling acetone.

The metal film 14 left on the surface of the semiconductor substrate 11 is used as a selective growth mask for regulating the growth of semiconductor single crystal to be performed by the next process, and is made of material allowing semiconductor to laterally grow on the surface of the metal film 14. As the material, other materials such as NiAl may be used in place of WSi.

Figure 3C:
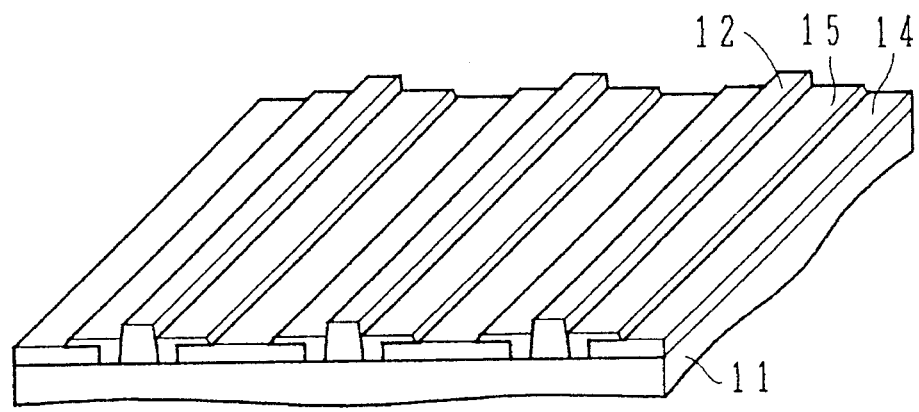

As shown in FIG. 3C, the semiconductor substrate 11 is set in an atomic layer epitaxy (ALE) growth apparatus and heated to a temperature of about 400° C. An n+-type InGaAs contact layer 15 is epitaxially grown under the growth pressure of about 20 Torr by using gases of trimethylindium (TMIn), triethylgallium (TEGa), arsine ($AsH_3$), hydrogen ($H_2$), and hydrogen selenide ($H_2Se$).

For introducing gases, a gas sequence (1) of $H_2$/TMIn/$H_2$/$AsH_3$=0.5 sec/1 sec/0.5 sec/5 sec and a gas sequence (2) of $H_2$/TEGa/$H_2$/$AsH_3$=0.5 sec/1 sec/0.5 sec/5 sec were repeated while continuously introducing a $H_2Se$ gas.

The contact layer 15 is selectively grown on the surface of the semiconductor substrate 11, and when it reaches the surface level of the metal layer 14, it is grown also laterally in the <1 1 0> direction and covers parts of the metal film 14 and the side walls of the insulating film 12. The growth of the contact layer 12 is limited by the insulating film 12, and the contact layers 15 on both the sides of the insulating film 12 are separated by the film 12.

Figure 4A:
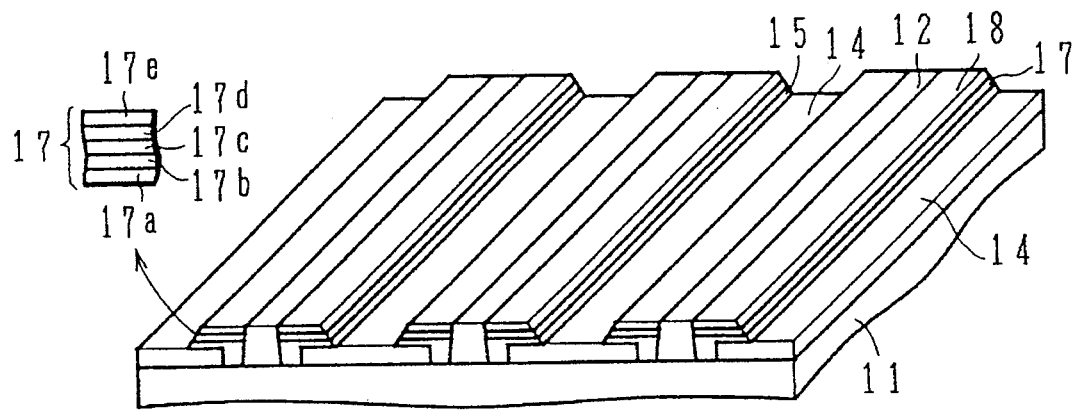

As shown in FIG. 4A, a resonance diode structure 17 is grown on the surface of the contact layer 15 by an ALE method. A semiconductor conductive layer 18 is epitaxially formed on the resonance tunnel diode structure 17.

As shown on the left side of FIG. 4A, the resonance tunnel diode structure 17 was formed by an n-type InGaAs layer 17a, and i-type InAlAs layer 17b of nine molecule layers, an i-type InGaAs 17c of fifteen molecule layers, an i-type InAlAs layer 17d of nine molecule layers, and an n-type InGaAs layer 17e.

For example, the n-type InGaAs layer 17a was grown at the substrate temperature of about 600° C., by using TMIn, TEGa, $AsH_3$, $H_2$, and $H_2Se$ under the growth pressure of 76 Torr, by repeating a gas sequence (1) of $H_2$/TMIn/$H_2$/$AsH_3$= 0.5 sec/1 sec/0.5 sec 5 sec and a gas sequence (2) of $H_2$/TEGa/$H_2$/$AsH_3$=0.5 sec/1 sec/0.5 sec/5 sec while continuously introducing H2Se gas.

Next, the i-type InAlAs layer 17b of nine molecule layers as the first barrier layer was grown at the same growth temperature and pressure, by repeating nine times a gas sequence (1) of $H_2$/TMIn/$H_2$/$AsH_3$=0.5 sec/1 sec/0.5 sec/ 5 sec and a gas sequence (2) of $H_2$/TEGa/$H_2$/$AsH_3$=0.5 sec/1 sec/0.5 sec/ 5 sec.

Next, the i-type InGaAs layer 17c of fifteen molecule layers as the well layer was grown at the same growth temperature and pressure, by repeating fifteen times a gas sequence (1) of $H_2$/TMIn/$H_2$/$AsH_3$=0.5 sec/1 sec/0.5 sec/5 sec and a gas sequence (2) of $H_2$/TEAl/$H_2$/$AsH_3$=0.5 sec/1 sec/0.5 sec/5 sec.

The i-type InAlAs layer 17d nine molecule layers as the second barrier layer was grown at the same growth temperature and pressure, by repeating nine times a gas sequence (1) of $H_2$/TMIn/$H_2$/$AsH_3$=0.5 sec/1 sec/0.5 sec/5 sec and a gas sequence (2) of $H_2$/TEGa/$H_2$/$AsH_3$=0.5 sec/1 sec/0.5 sec/ 5 sec.

Then, the n-type InGaAs layer 17e was grown at the same growth temperature and pressure, by repeating a gas sequence (1) of $H_2$/TMIn/$H_2$/$AsH_3$=0.5 sec/1 sec/0.5 sec/ 5 sec and a gas sequence (2) of $H_2$/TEGa/$H_2$/$AsH_3$=0.5 sec/1 sec/0.5 sec/ 5 sec while continuously introducing a $H_2Se$ gas.

In the above manner, separated resonance tunnel diode structures are formed on the sides of each striped insulating film 12. In this condition, the surface of the epitaxially grown layer is lower than the surface of the insulating film 12.

Next, the n-type InGaAs layer 18 was grown at the substrate temperature of about 400° C., by using TMIn, TEGa, $AsH_3$, $H_2$, and $H_2Se$ under the growth pressure of 20 Torr.

For example, the n-type InGaAs layer 18 as the conductive layer was formed by repeating a gas sequence (1) of $H_2$/TMIn/$H_2$/$AsH_3$=0.5 sec/1 sec/0.5 sec/ 5 sec and a gas sequence (2) of $H_2$/TEGa/$H_2$/$AsH_3$=0.5 sec/1 sec/0.5 sec/ 5 sec while continuously introducing a H2Se gas.

Figure 4B:
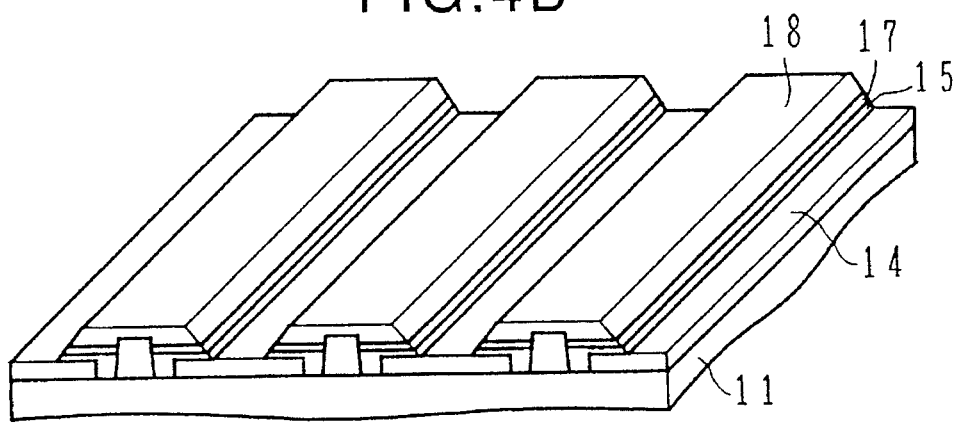

With this growth, the conductive layer 18 first grows to the same surface level of the insulating film 12 while the lateral growth is suppressed by the insulating film 12 as shown in FIG. 4A. Thereafter, as shown in FIG. 4B, when the conductive layer 18 exceeds the surface level of the insulating film 12, it also grows laterally on the top surface of the insulating film 12 and continues to grow as an integral single crystal semiconductor layer. In this manner, the continuous integral conductive layer 18 connects in parallel each pair of resonance tunnel diode structures.

Figure 4C:
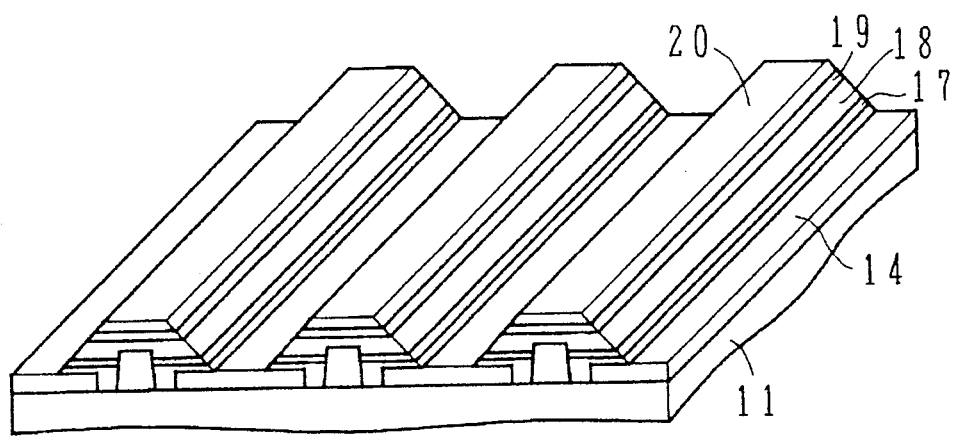

Next, as shown in FIG. 4C, an i-type InAlGaAs tunnel barrier layer 19 is grown on the conductive layer 18 by an ALE method. For example, the tunnel barrier layer 19 was made of six hundreds and eighty six molecule layers at the growth temperature of about 600° C. and under the growth pressure of 76 Torr, by introducing gases of TMIn, TEAl, TeGa, AsH$_3$, and H$_2$Se.

For example, the tunnel barrier layer 19 was formed by repeating 683 times a gas sequence (1) of H$_2$/TMIn/H$_2$/AsH$_3$=0.5 sec/1 sec/0.5 sec/ 5 sec, a gas sequence (2) of H$_2$/TEAl/H$_2$/AsH$_3$=0.5 sec/1 sec/0.5 sec/5 sec, a gas sequence (3) of H$_2$(TMIn/H$_2$/AsH$_3$=0.5 sec/1 sec/0.5 sec/ 5 sec, and a gas sequence (4) of H$_2$/TEGa/H$_2$/AsH$_3$=0.5 sec/1 sec/0.5 sec/ 5 sec.

An n-type InGaAs conductive layer 20 is grown to a thickness of about 500 angstroms on the surface of the tunnel barrier layer 19 by an ALE method similar to the conductive layer 18. The growth conditions are set to form a normal mesa type taper structure wherein the epitaxial laminated layer structure has a narrower width at the upper layer.

The tapered side surface is the (1 1 1) plane. At the last half of the growth, the concentration of H$_2$Se is made high to grow an n$^+$-type INGaAs contact layer.

Figure 5A:
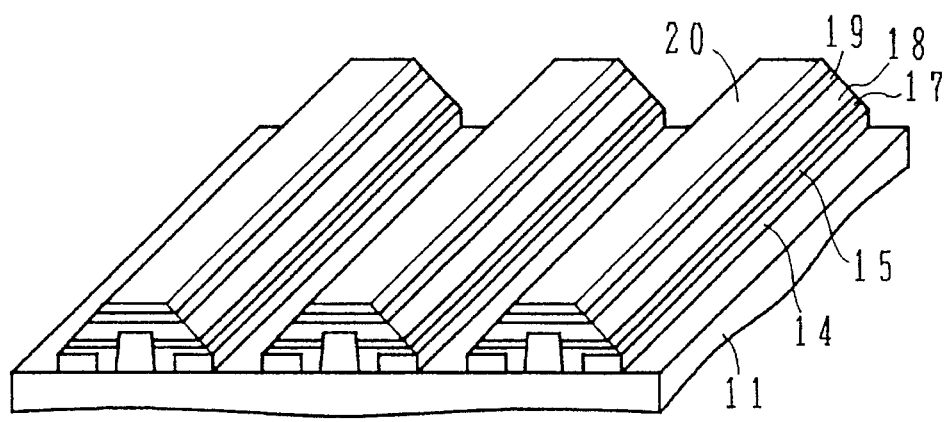

Next, as shown in FIG. 5A, the exposed metal film 14 is selectively etched by an RIE method by using a mixed etching gas of CF$_4$+O$_2$ to remove the exposed metal film 14. The metal film 14 portions under the semiconductor laminated structure are separated.

Figure 5B:
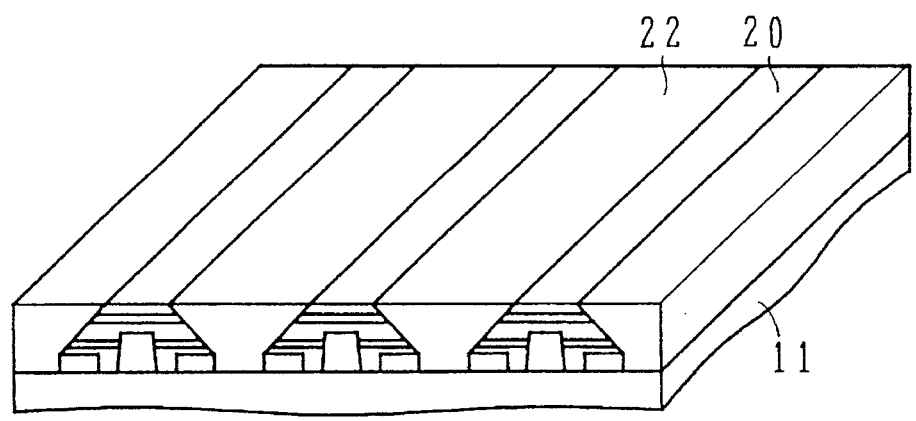

As shown in FIG. 5B, polyimide is coated on the surface of the semiconductor substrate 11 to form a polyimide region 22. The uneven surface of the laminated epitaxial layers on the semiconductor substrate 11 is filled with the polyimide region 22 so that the finished surface becomes flat. The conductive layer 20 is exposed on this flat surface. This flat surface is effective for obtaining a good resolution of photolithography.

Figure 5C:
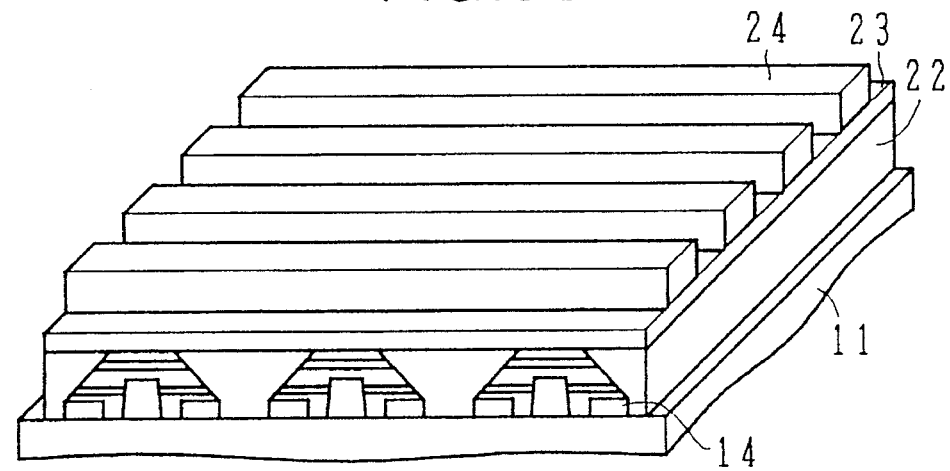

Thereafter, as shown in FIG. 5C, a metal layer 23 such as AuGe/Au (thickness 200/2000 angstroms) is deposited by electron beam evaporation or the like. A resist layer is formed on the metal layer 23 to form a resist pattern 24 perpendicular to the striped direction of the metal film 14. Using the resist pattern 24 as an etching mask, the underlie metal layer 23 is selectively etched by Ar ion milling.

Figure 6A:
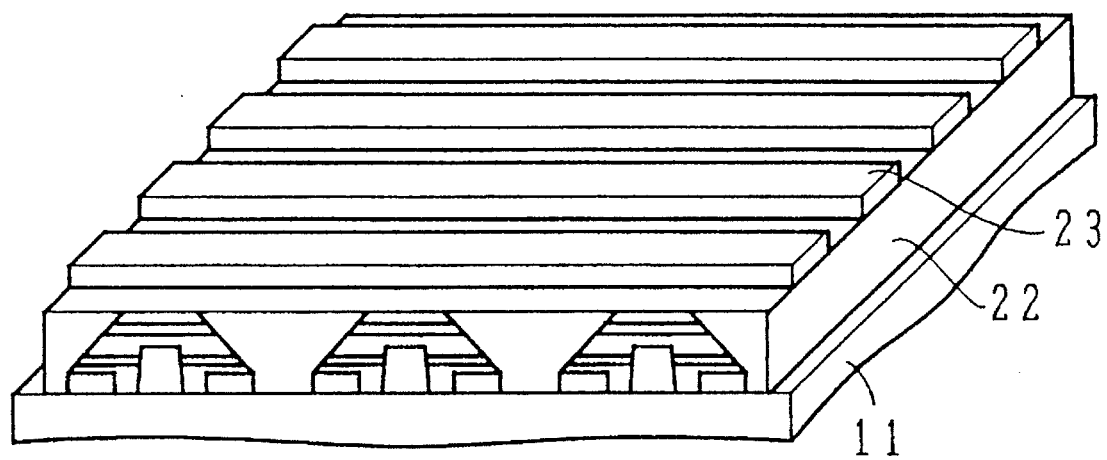

As shown in FIG. 6A, after etching the metal layer 23, the resist pattern is removed to obtain striped electrodes of the metal layer 23.

Figure 6B:
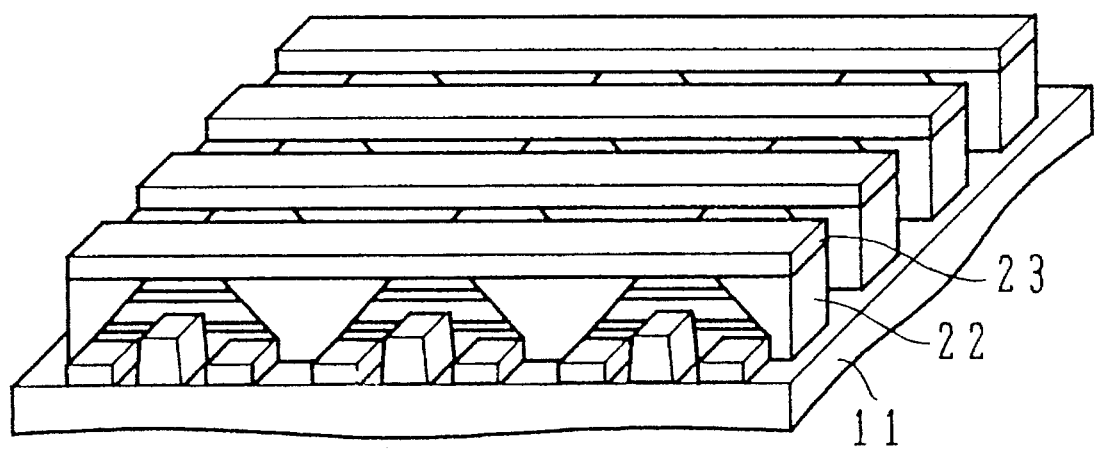

Thereafter, as shown in FIG. 6B, the epitaxial semiconductor laminated layers and polyimide region not covered by the metal layer 23 are removed by selective etching of an RIE method by using a mixed gas of CF$_4$ and H$_2$.

Figure 7A:
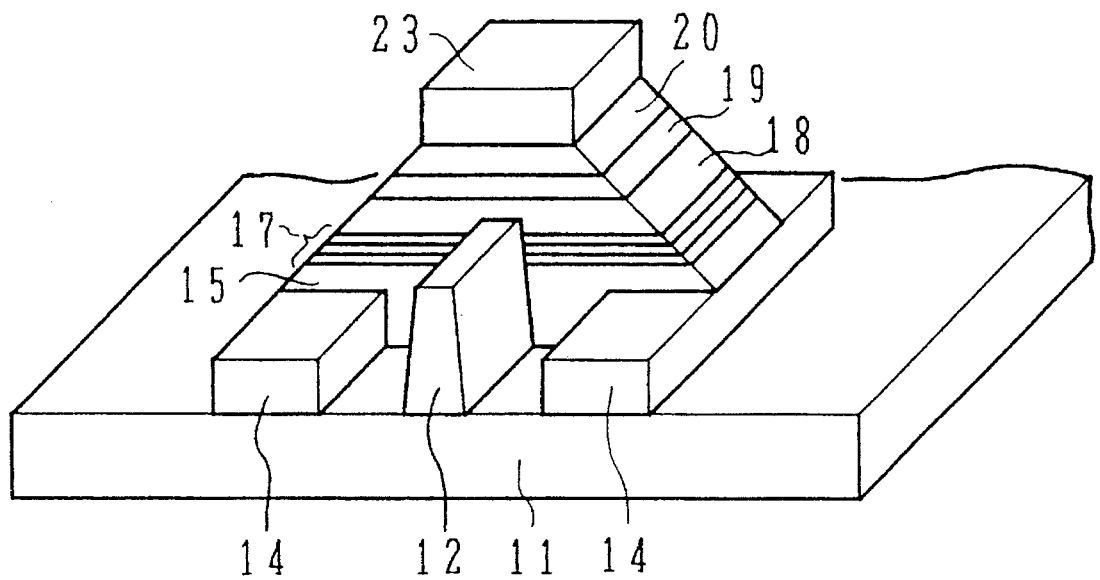
FIGS. 7A and 7B are a perspective view of the semiconductor device of the first embodiment and its equivalent circuit diagram.

In the manner described above, a semiconductor device structure shown in FIG. 7A can be obtained. This semiconductor device structure has a pair of resonance tunnel diode structures at the regions separated by the insulating film 12, and has a single common tunnel diode structure above the insulating film 12.

The pair of resonance tunnel diode structures is connected by the metal film 14, and the tunnel diode structure is connected to the metal layer 23, thereby forming a double-emitter type RHET structure of inverted configuration.

The tapered side walls of the device structure are formed by the crystal growth, and only the other pair of side walls is subjected to a fine process. Since the region underwent the fine process is limited, damages to be caused by the fine process can be reduced.

Figure 7B:
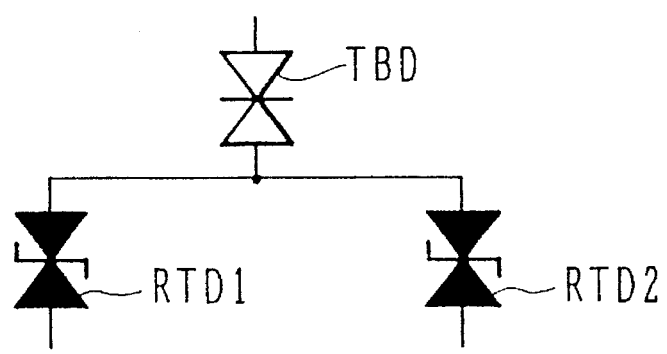

FIG. 7B is an equivalent circuit of the device structure shown in FIG. 7A. A single tunnel barrier diode TBD is connected to a parallel circuit of two resonance tunnel diodes RTD1 and RTD2, forming as a whole a double-emitter RHET structure.

The resonance tunnel diode RTD has a quantized structure of electron energy levels in the well layer sandwiched between a pair of barrier layers. The height and thickness of a barrier layer are selected to allow electrons to tunnel therethrough.

A tunnel current can flow only when the energies of electrons outside of the barrier layer are equal to the quantized levels of electrons in the well layer. Therefore, the resonance tunnel diode has a negative differential resistance. Although electrons are used in the above description, it is also applicable to holes.

With this device structure, when predetermined voltages are applied to the resonance tunnel diodes RTD1 and RTD2, the potential at the interconnection point between the diodes takes one of two stable states. This function can be used in realizing an SRAM. The potential at the interconnection point can be read or written via a tunnel barrier diode TBD.

In the above description, InP has been used as the semiconductor substrate. Other semiconductors such as GaAs may also be used. The epitaxial semiconductor laminated structure formed on a semiconductor substrate may be selected as desired depending upon the type of a semiconductor substrate.

FIGS. 8A to 13B are diagrams explaining of the semiconductor device manufacturing method according to another embodiment of the present invention. The diagrams having the serial number added with "A" are plan views, and the diagrams having the serial number added with "B" are cross sectional views.

In this embodiment, an insulating film pattern and a metal layer pattern are used as the opening defining members to automatically separate regions where semiconductor epitaxial structures are selectively grown. The need of a fine process is further alleviated.

Figure 8A:
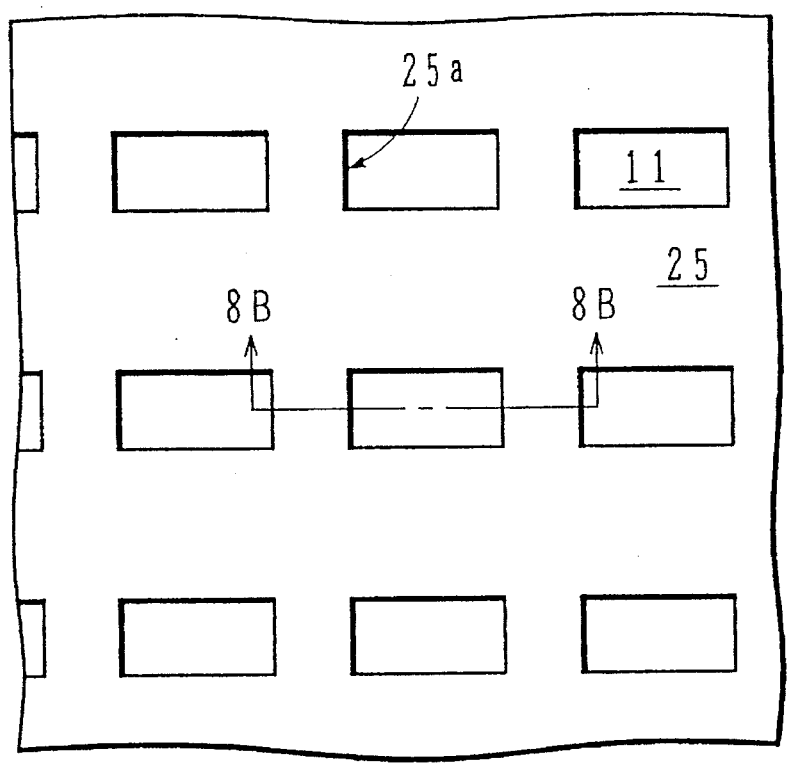
FIGS. 8A–8B, 9A–9B, and 10A–10B are plan views and cross sectional views illustrating the semiconductor device manufacturing method according to a second embodiment of the present invention.
Figure 8B:
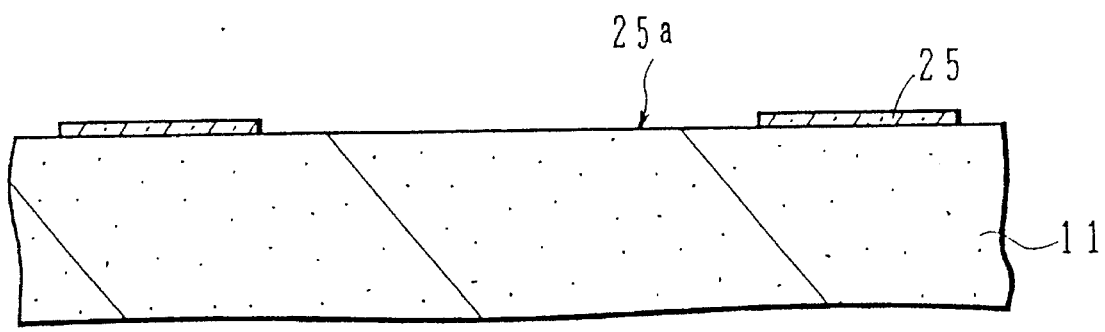

As shown in FIGS. 8A and 8B, on a semiconductor substrate 11 made of a non-doped semiinsulating GaAs substrate and having the (0 0 1) plane, an insulating film 25 made of an AlN film and having a thickness of about 200 angstroms is deposited, for example, by sputtering an Al target in a (N$_2$+Ar) atmosphere at the substrate temperature of 350° C.

Thereafter, a photoresist layer is coated on the insulating film 25 and patterned to form a resist mask for forming openings. Using this resist mask, wet etching is performed to form openings 25a in the insulating film 25, by using H$_3$PO$_4$ as an etchant and at a temperature of about 90° C. The surface of the semiconductor substrate 11 is exposed only at the openings 25a. Each opening 25a has two sides in the <1–1 0 > direction and the other two sides in the <1 1 0> direction.

As the insulating film 25 of AlN, other insulating material such as SiO$_2$, Si3N$_4$, and SiON may also be used.

Figure 9A:
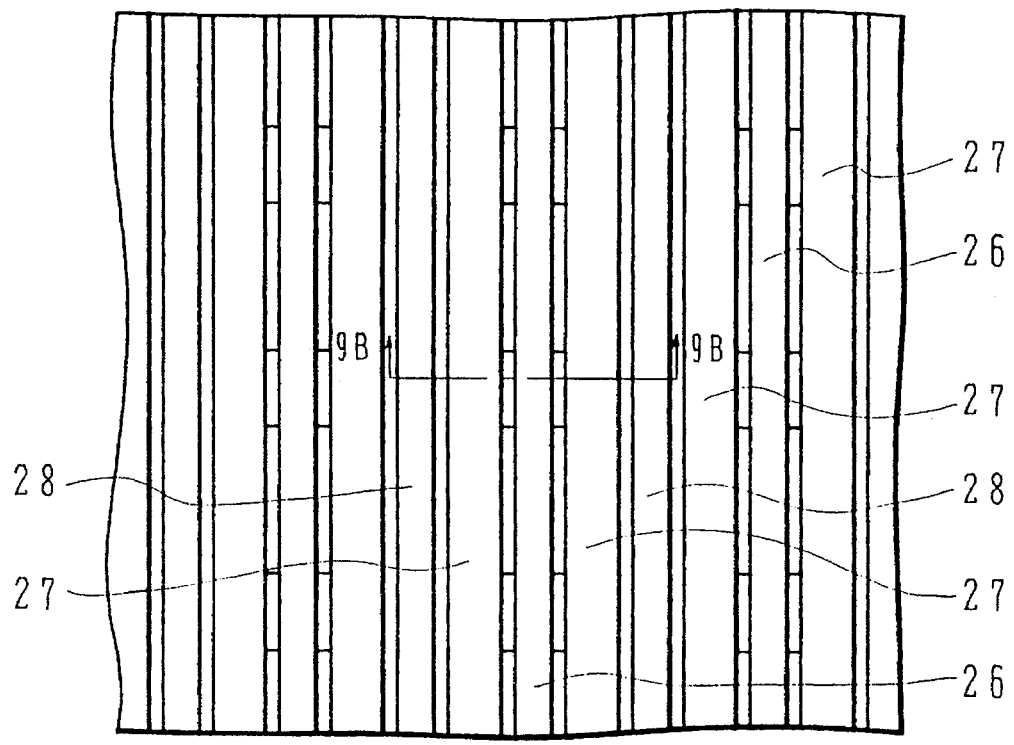
Figure 9B:
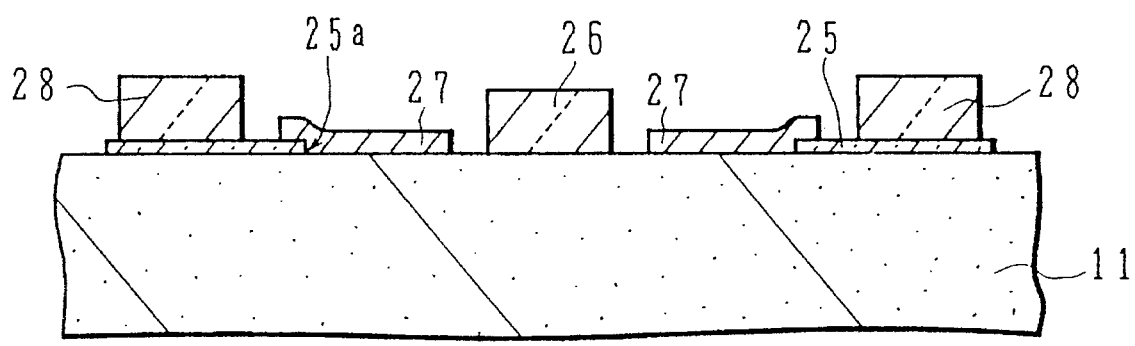

As shown in FIGS. 9A and 9B, on the surface of the semiconductor substrate 11 formed with the insulating film 25, an insulating film pattern and a metal film pattern are formed.

For example, an insulating film made of an SiO$_2$ film and having a thickness of about 1500 angstroms is deposited by a plasma CVD method by introducing a mixed gas or SiH$_4$, N$_2$O, and N$_2$ at the substrate temperature of about 300° C. This insulating film is made of a material having an etching characteristic different from that of the insulating film 25. A photoresist layer is coated on the insulating film and patterned to form a resist pattern aligned in the <1 −1 0> direction.

Using this resist pattern as an etching mask, the underlie SiO$_2$ film is etched, for example, by RIE using a mixed gas of CHF$_3$ and CF$_4$ and by wet-etching using a mixed solution of HF, NH$_4$F, and H$_2$O, to form an insulating film stripe 26 running at the middle of the opening 25a and insulating film stripes 28 running at the intermediate between adjacent openings 25a. Since wet etching is used in addition to RIE, undercuts are formed under the resist pattern.

The insulating film stripe 28 is formed on the insulating film 25 over the whole area of the substrate 11, whereas the insulating film stripe 26 runs alternately on the insulating film 25 and on the surface of the substrate exposed at the openings 25a. Each opening 25a is divided into two regions by the insulating film stripe 26.

A metal film made of a Si film and having a thickness of about 500 angstroms is deposited by Ar sputtering or the like, without removing the resist pattern. Thereafter, the resist pattern is removed to lift off the unnecessary regions of the metal film.

Since the metal film is not formed at the undercut under the resist pattern, a metal film 27 formed on the substrate surface is spaced apart form the insulating film stripes 26 and 28 by a predetermined distance, forming stripe gaps therebetween. The metal film stripe 27 shown in FIG. 10b is electrically separated from another metal film stripe 27 on the next opening 25a in the lateral direction.

In this manner, as shown in the plan view of FIG. 9A and in the cross sectional view of FIG. 9B, there are formed the insulating film stripe 26 running at the middle of the opening 25a, the metal film stripes 27 running on both the sides of the insulating film stripe 26 and extending from the opening surface to the insulating films 25, and the insulating film stripes 28 disposed on the insulating films 25 between the adjacent openings 25a.

The stripe gaps are also formed between the insulating film stripe 26 running at the middle of the opening 25a and the metal film stripes 27 on both the sides of the insulating film stripe 26. As stated previously, the insulating films 26 and 28 are made of a material having an etching characteristic different from that of the insulating film 25. Materials other than SiO$_2$ such as Si$_3$N$_4$ and SiON may also be used.

As the material of the metal film 27 of WSi, other metals such as NiAl may also be used which serve as a mask for selectively growing semiconductor crystal and allow semiconductor to grow laterally on the metal surface.

Figure 10A:
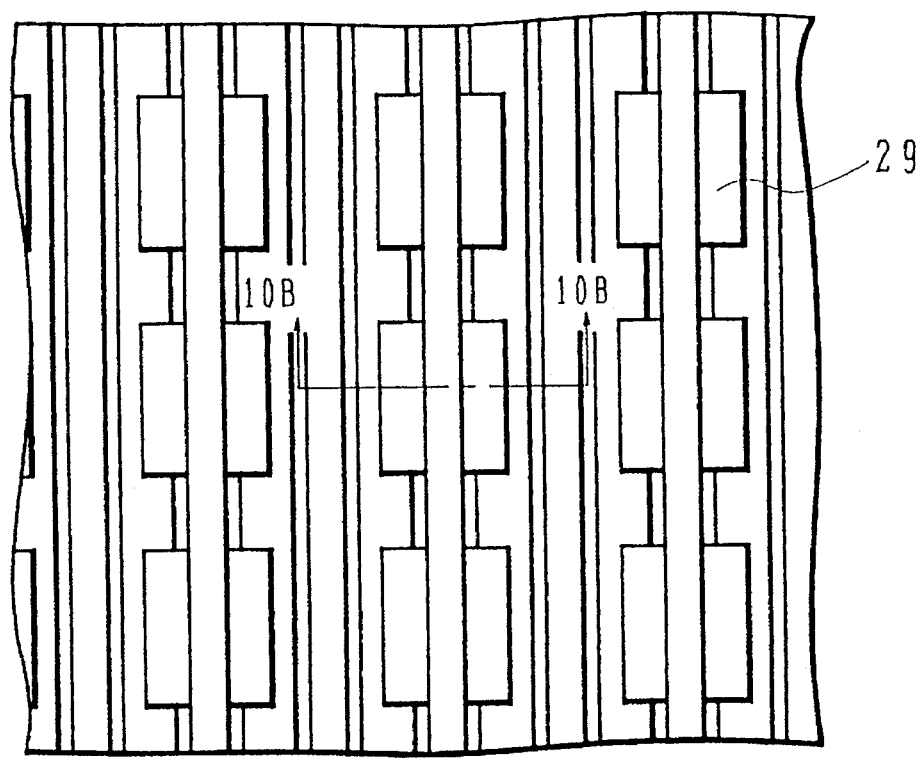
Figure 10B:
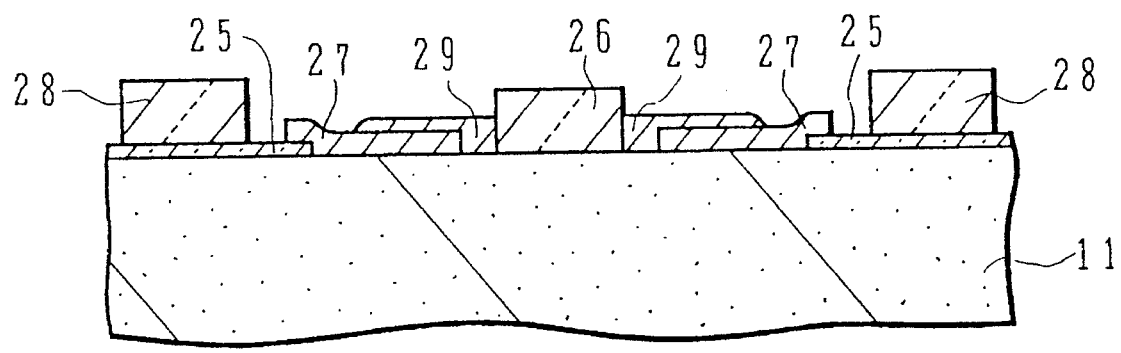

Next, as shown in FIGS. 10A and 10B, semiconductor crystal is selectively grown from the surface of the semiconductor substrate 11 exposed in the opening to form contact layers 29. The contact layer 29 is made of, for example, a GaAs layer containing a great amount of n-type impurities and having a thickness of about 800 angstroms.

The contact layer 29 can be selectively grown only in the opening, for example, by repeating a gas sequence of H$_2$/TMGa/H$_2$/AsH$_3$=0.5 sec/1 sec/0.5 sec/5 sec while continuously supplying H$_2$Se at a growth temperature of 500° C.

When the contact layer 29 reaches the surface level of the metal layer 27, it also grows laterally on the surface of the metal layer 27. The contact layer 29 has two sides in the <1 −1 0> and the other two sides in the <1 1 0> as shown in FIG. 10A.

By controlling the opening pattern and the growth time of the contact layers 29, the contact layers 29 are separated also in the stripe direction of the insulating film 26 and metal film 27, as shown in FIG. 10A.

Figure 11A:
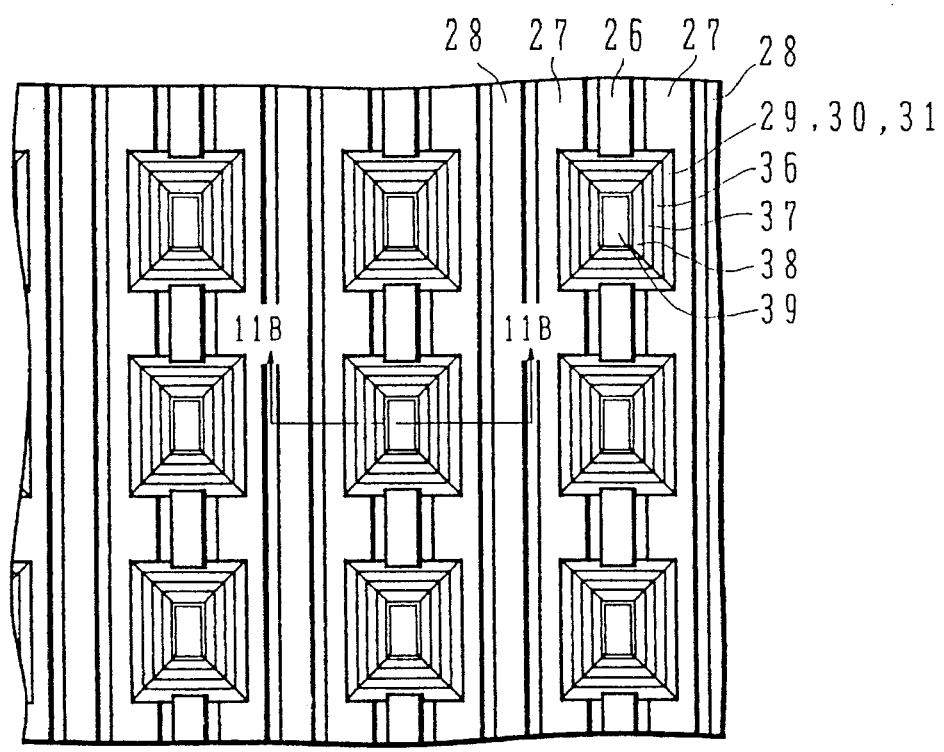
FIGS. 11A–11C are a plan view and cross sectional views illustrating the semiconductor device manufacturing method of the second embodiment.
Figure 11B:
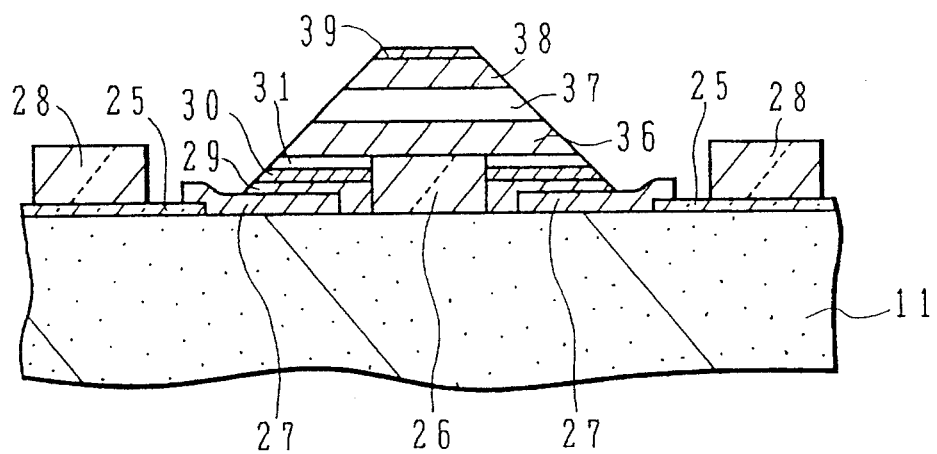
Figure 11C:
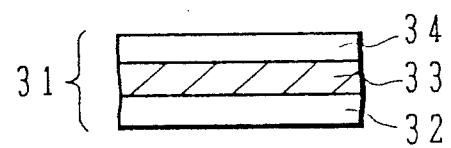

Next, as shown in FIGS. 11A to 11C, a semiconductor laminated structure constituting an RTD is grown on the contact layers 29. FIG. 11C is a cross sectional view of the resonance tunnel diode structure.

First, a GaAs conductive layer 30 having an n-type impurity concentration of 1 * 10$^{18}$cm$^{-3}$ is grown to a thickness of about 500 angstroms by a metal organic vapor phase epitaxy (MOVPE) method at a growth temperature of 650° C. and under a growth pressure of 76 Torr. The mixed gas introduced is TMGa, H$_2$, AsH$_3$, and H$_2$Se.

Next, a barrier layer 32 of the resonance tunnel barrier structure 31 (refer to FIG. 11C) is grown, the barrier layer being an i-type AlAs layer of ten molecule layers. This layer is grown by an ALE method at a growth temperature of 500° C., under a growth pressure of 20 Torr, and with an introduced mixed gas of TMAl, H$_2$, and AsH$_3$. The AlAs layer of ten molecule layers is formed by repeating ten times a gas sequence of H$_2$/TMAl/H$_2$/AsH$_3$=0.5 sec/3 sec/0.5 sec/5 sec.

A well layer 33 of the resonance tunnel diode structure 31 is formed, this layer being a GaAs layer of fifteen molecule layers. The well layer may be formed by repeating fifteen times a gas sequence of H$_2$/TMGa/H$_2$/AsH$_3$=0.5 sec/3 sec/0.5 sec/5 sec at a growth temperature of 500° C., under a growth pressure of 20 Torr, and with an introduced mixed gas of TMGa, H$_2$, and AsH$_3$.

Next, a barrier layer 34 at the topmost layer of the resonance tunnel diode structure 31 is grown by the same method used for the barrier layer 32. A conductive layer 36 made of a GaAs layer same as the conductive layer 30 is formed on the resonance tunnel diode structure 31.

The resonance tunnel barrier structure 31 is formed lower than the insulating film stripe 26 so that two resonance tunnel diode structures are separated by the insulating film 26.

As the conductive layers 36 grow on the resonance tunnel diode structures 31 and exceed the surface level of the insulating film 26, they also grow laterally on the insulating film to form a single integral conductive layer 36.

The conductive layer may be grown by an ALE method, and more preferably it is grown by an MOVPE method achieving a faster growth speed. For example, a GaAs layer containing an n-type impurity concentration of 1 * 10$^{18}$cm$^{-3}$ is grown by an MOVPE method to a thickness of about 1000 angstroms at a growth temperature of 650° C., under a growth pressure of 76 Torr, and with an introduced mixed gas of TMGa, H$_2$, and AsH$_3$.

Next, TMAl gas is added as the introduced mixed gas to grow an i-type AlGaAs tunnel barrier layer (collector barrier) 37 by an MOVPE method. A conductive layer 38 made of GaAS like the conductive layer 36 is grown on the tunnel barrier layer 37 by an MOVPE method. Lastly, a contact layer 39 containing a higher n-type impurity concentration is grown by an MOVPE method. These MOVPE methods may be carried out, for example, at the same growth temperature of 650° C. and under the same growth pressure of 76 Torr.

For example, the tunnel barrier layer 37 is made of an i-type $Al_{0.3}Ga_{0.7}As$ layer having a thickness of 1000 angstroms. The conductive layer 38 is made of an n$^+$-type GaAs layer having a thickness of 500 angstroms and an n-type impurity concentration of $8 * 10^{18} cm^{-3}$. The contact layer 39 is made of an n$^+$-type GaAs layer having a thickness of 500 angstroms and an n-type impurity concentration of $8 * 10^{18} cm^{-3}$.

With the above-described epitaxial growth conditions, the laminated growth layers are surrounded by the (1 1 1) A planes in the <1 1 0> direction and by the (1 1 1) B planes in the <1 –1 0> direction, forming a pyramid structure shown in FIGS. 11A and 11B.

Figure 12A:
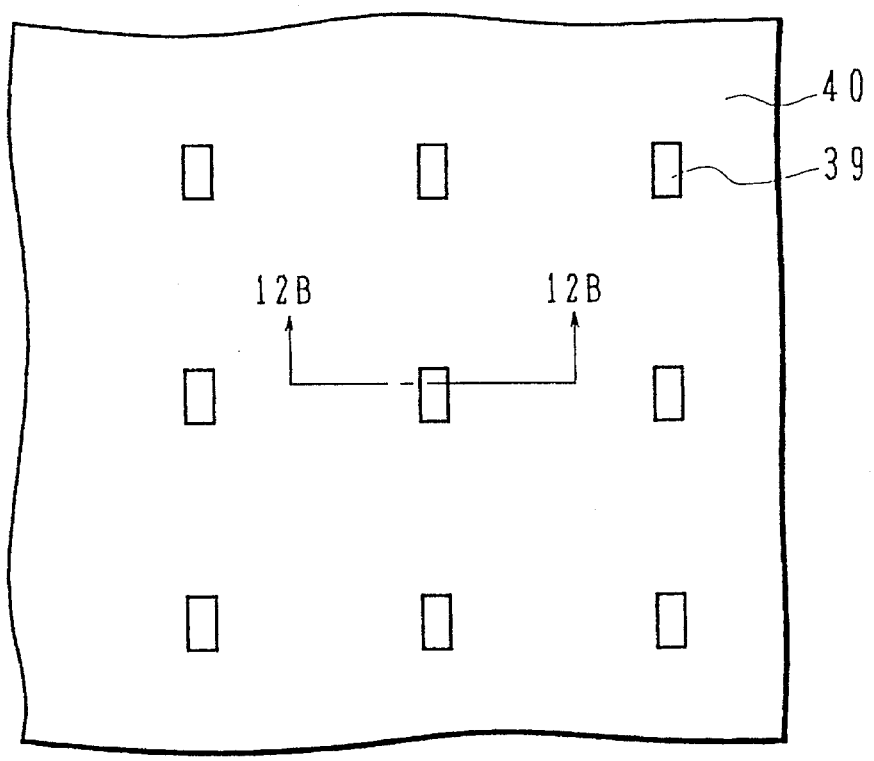
FIGS. 12A–12B, and 13A–13B are plan views and cross sectional views illustrating the semiconductor device manufacturing method of the second embodiment.
Figure 12B:
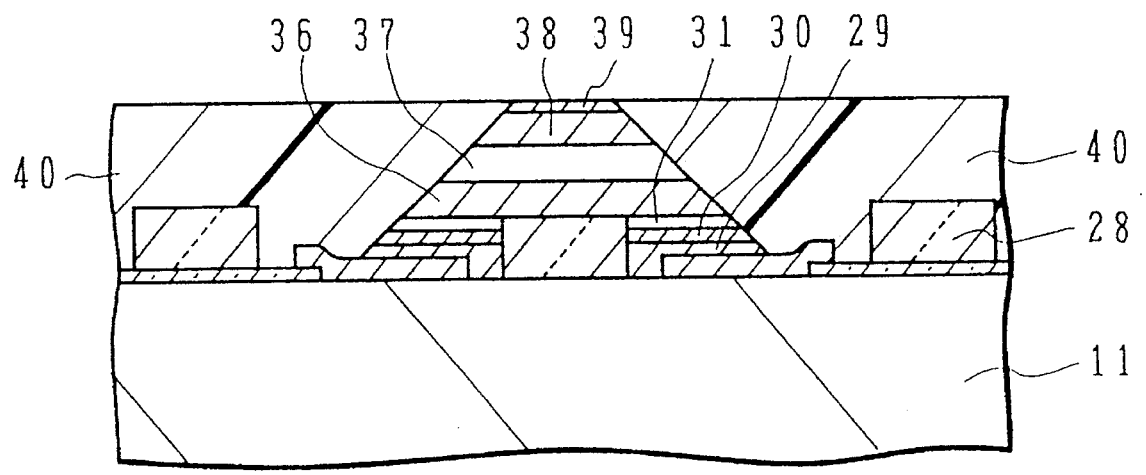

Thereafter, as shown in FIGS. 12A and 12B, polyimide is coated on the surface of the semiconductor substrate 11 to form a polyimide region 40 exposing only the surface of the contact layers 39.

Figure 13A:
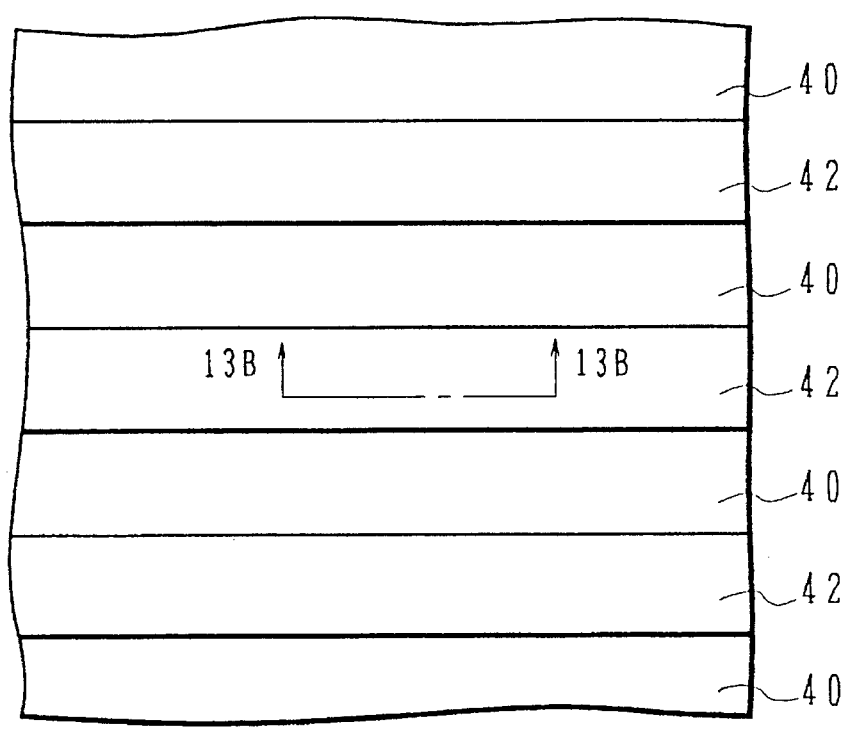
Figure 13B:
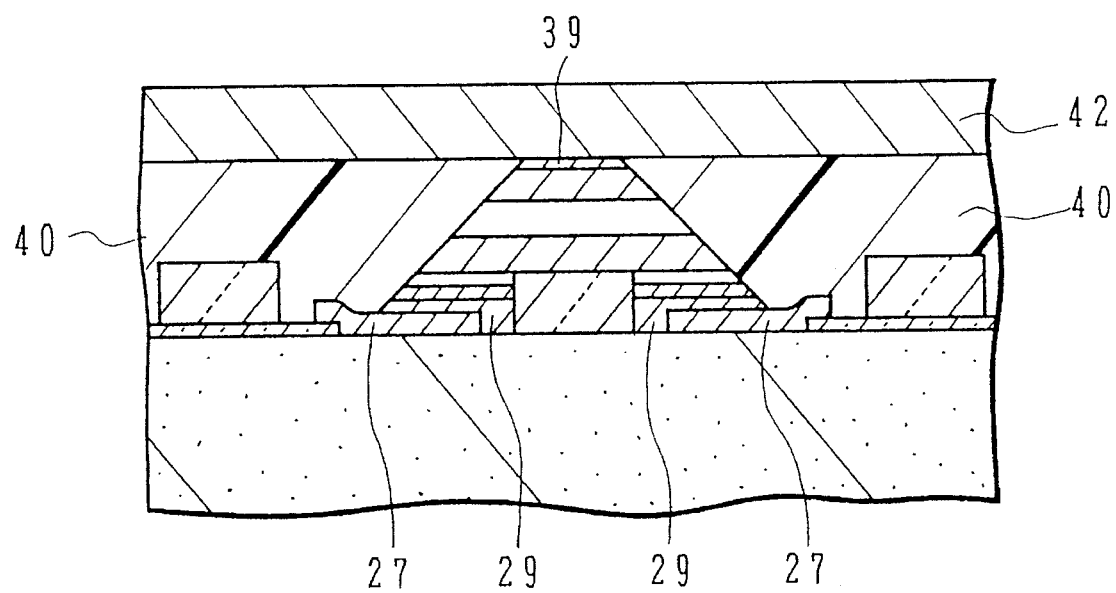

As shown in FIGS. 13A and 13B, a striped resist pattern (having openings at the regions of metal layer stripes 42 to be described later) is formed on the surfaces of the polyimide region 40 and contact layers 39. A metal layer, for example, AuGe/Au (thickness of 200/2000 angstroms), is deposited and the resist pattern is removed to obtain the metal layer stripes 42. The material of the metal layer is not limited to AuGe/Au, but any other material may be used if it provides an ohmic contact with the semiconductor conduct layer.

According to this embodiment, the device structure can be obtained only by the growth technique and coating technique excepting the fine processes for patterning the insulating film 25 shown in FIGS. 8A and 8B and for patterning the insulating films 26 and 28 shown in FIGS. 9A and 9B. Accordingly, damages in the semiconductor crystal can be alleviated, providing a fine semiconductor device having a good performance.

In the second embodiment, the semiconductor laminated structure of a pyramid shape (or normal mesa shape) has been formed by selective growth. The structure of a different shape may be formed by controlling the growth conditions.

Figure 14A:
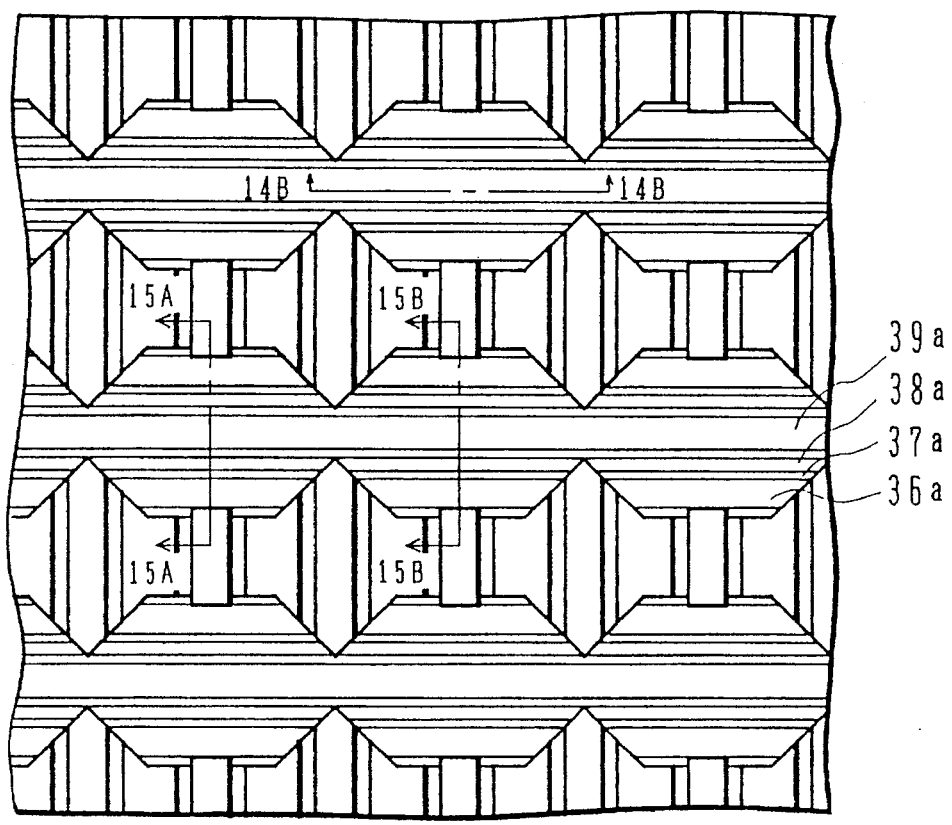
FIGS. 14A–14B, 15A–15B, 16A–16B, and 17A–17B are plan views and cross sectional views illustrating the semiconductor device manufacturing method according to a third embodiment of the present invention.

FIGS. 14A to 17B are diagrams explaining a third embodiment of the semiconductor device manufacturing method according to the present invention, wherein the side walls of the laminated semiconductor structure have normal mesa planes and inverted mesa planes. In this embodiment, after executing the processes of the second embodiment explained with FIGS. 8A to 10B, an epitaxial growth process illustrated in FIGS. 14A and 14B is executed. FIG. 14A is a plan view, and FIG. 14B is a cross sectional view.

In forming the resonance tunnel barrier structure 31a, similar to the second embodiment, executed area an MOVPE method at the growth temperature of 650° C. and under the growth pressure of 76 Torr and an ALE method at the growth temperature of 500° C. and under the growth pressure of 200 Torr. The layer 36a and other layers on the layer 36a are grown by an MOVPE method at a growth temperature of 500° C. and under a growth pressure of 76 Torr.

The growth conditions controlled as above are used to grow the conductive layer 36a, tunnel barrier layer 37a, conductive layer 38a, and contact layer 39a, with a pair of side walls thereof having normal mesa planes and the other pair having inverted mesa planes. The side walls in section in both the <1 1 0> and <1 –1 0> directions are formed by the (1 1 1) B planes.

With the inverted mesa (upwardly diverging) planes, the conductive layer 38a and contact layer 39a are continuous in the <1 1 0> direction, each forming an electrically connected layer. However, the semiconductor laminated layers are separated in the <1 –1 0> direction like the second embodiment because of the normal mesa (upwardly converging) planes.

Figure 15A:
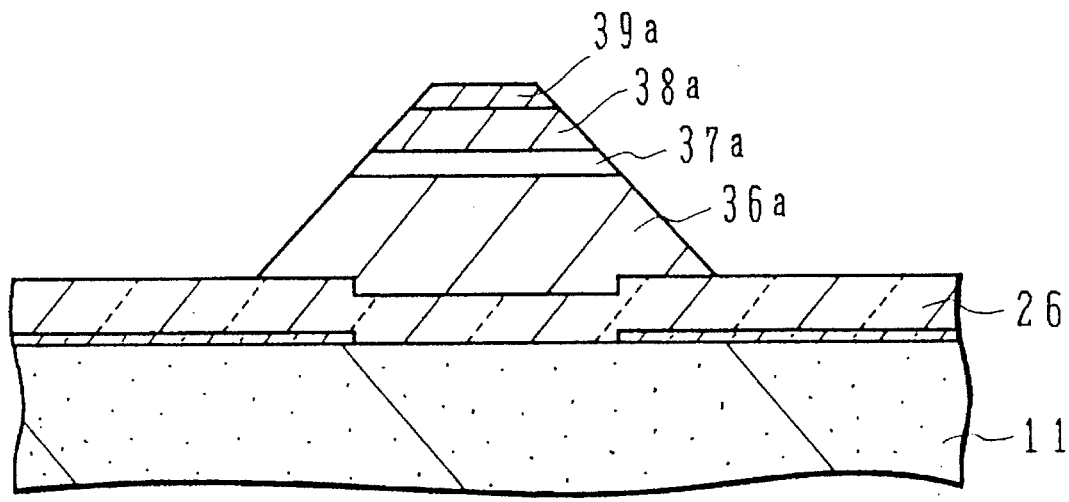
Figure 15B:
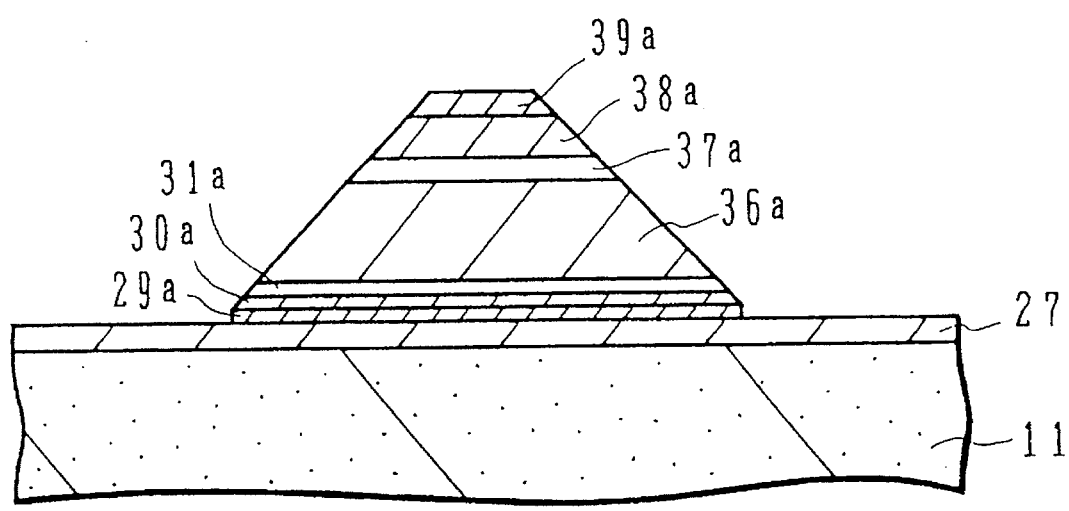

FIGS. 15A and 15B are cross sectional views taken along lines 15A—15A and 15B—15B shown in FIG. 14A. The shapes of the cross sections are the same as the second embodiment. The RTD structure 31a is separated by the insulating film stripe 26. A pair of RTD structures are connected by the conductive layer 36a above the insulating film stripe 26.

Figure 14B:
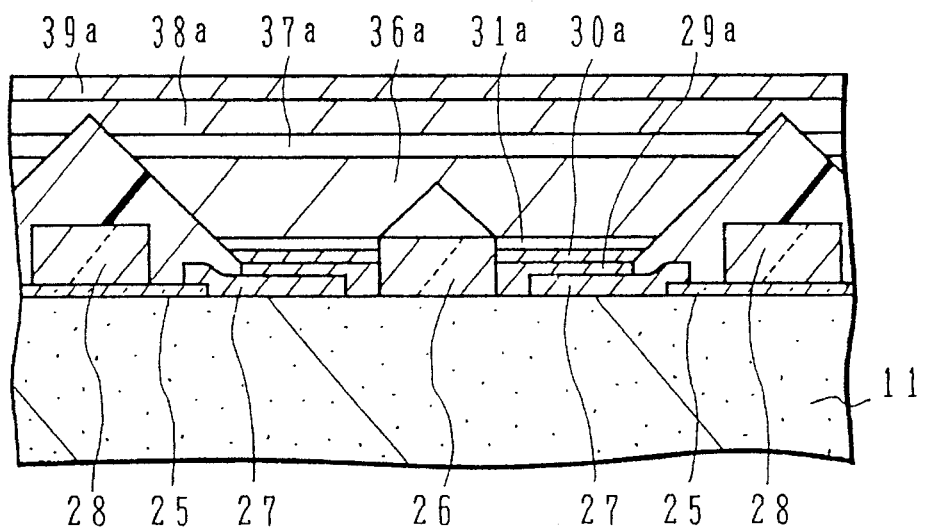

The semiconductor laminated structures grown on the openings, separated at the lower layers, and made continuous at the upper layers as shown in FIG. 14B, can be formed only by the growth processes.

Since the growth processes are executed for forming the (1 1 1) B planes, an air gap is formed above the insulating film 26. If this gap is positively uses, the surface level of the insulating film 26 is not necessarily required to be higher than the resonance tunnel diode structure.

Using an insulating film 26 higher than the contact layer 29a on which the lateral growth is secured, two resonance tunnel diode structures can be separated by the air gap.

Figure 16A:
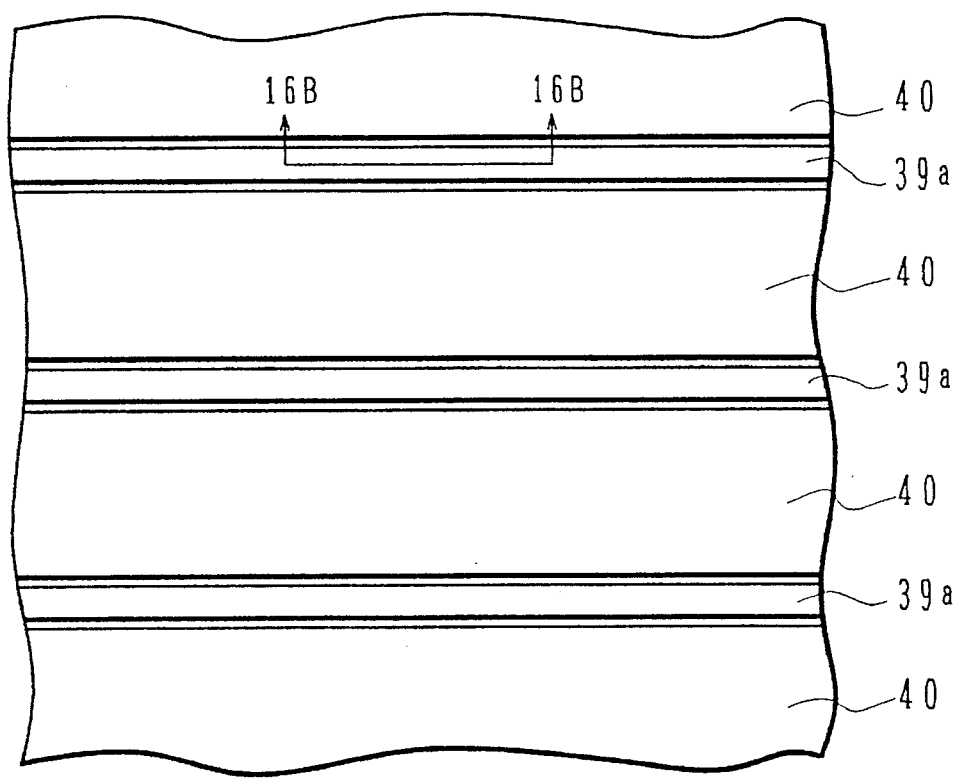
Figure 16B:
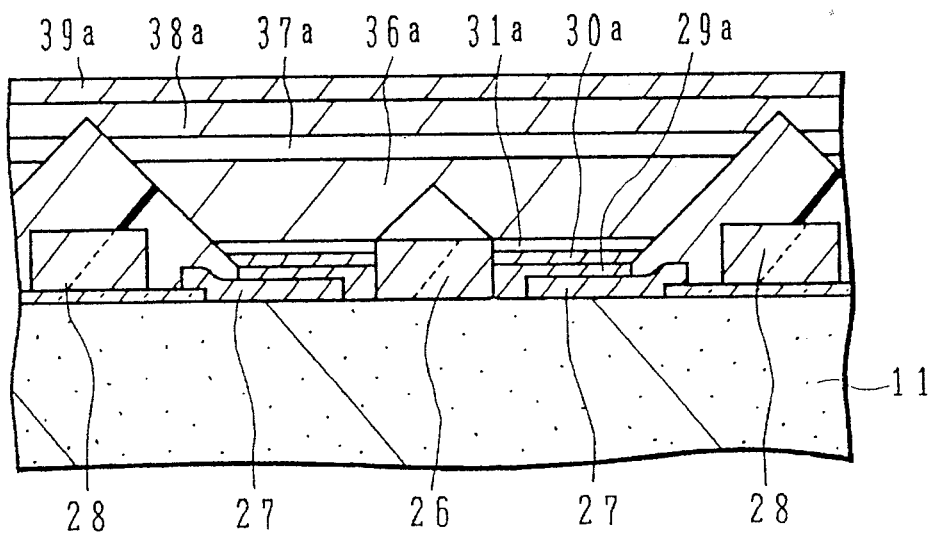

After the epitaxial growth illustrated in FIGS. 14A, 14B, 15A, and 15B, polyimide is coated on the semiconductor substrate to fill it in the recesses and voids, as shown in FIGS. 16A and 16B. FIG. 16A is a plan view and FIG. 16B is a cross sectional view. The contact layers 39a are exposed from the polyimide region 40.

Figure 17A:
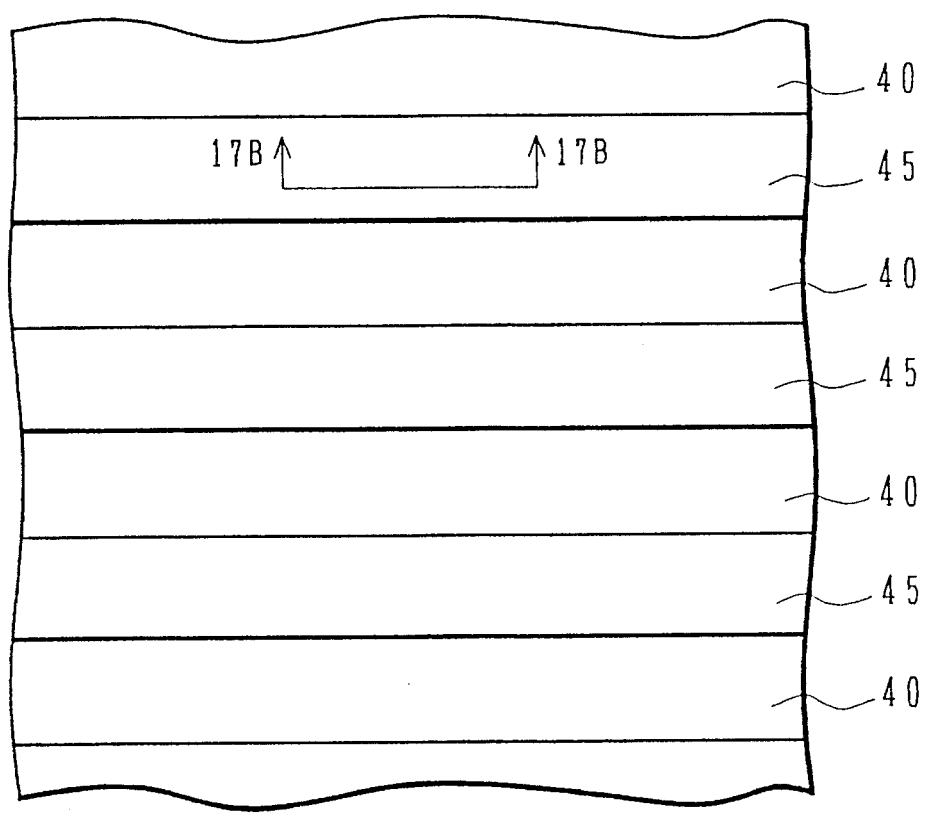
Figure 17B:
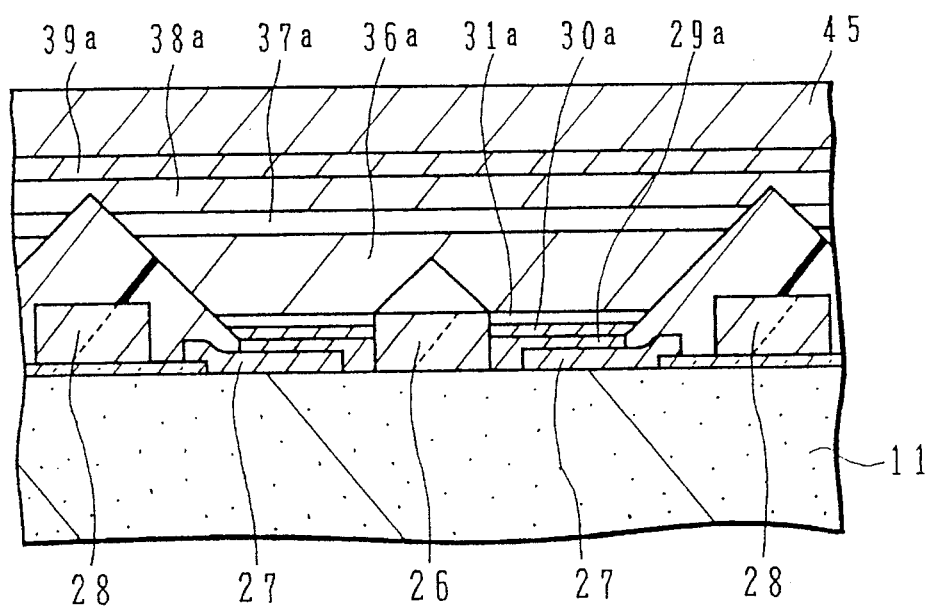

Next, as shown in FIGS. 17A and 17B, a resist pattern is formed on the contact layer 39a at the electrode unnecessary regions to form an electrode pattern. A metal film is deposited on the semiconductor substrate formed with the resist pattern in the manner like the second embodiment. The resist pattern is then removed to lift off the unnecessary metal film and leave only a metal film 45 forming the electrode pattern.

In the above manner, a semiconductor device having the same function as the second embodiment can be formed by a reduced number of manufacturing processes.

In the above-embodiments, double-emitter type resonance hot electron transistors have been formed. Other types of semiconductor devices may also be formed. For example, a Schottky electrode structure may be incorporated instead of the resonance tunnel diode structure to form a Schottky double-emitter hot electron transistor type semiconductor device. Various types of semiconductor devices may be formed other than hot electron transistors.

FIGS. 18A to 31B illustrate a fourth embodiment of the semiconductor device manufacturing method according to the present invention. In this embodiment, a memory circuit shown in FIG. 32 is formed by using AlGaAs/GaAs double-emitter type hetero bipolar transistors shown in FIG. 32A.

Figure 18A:
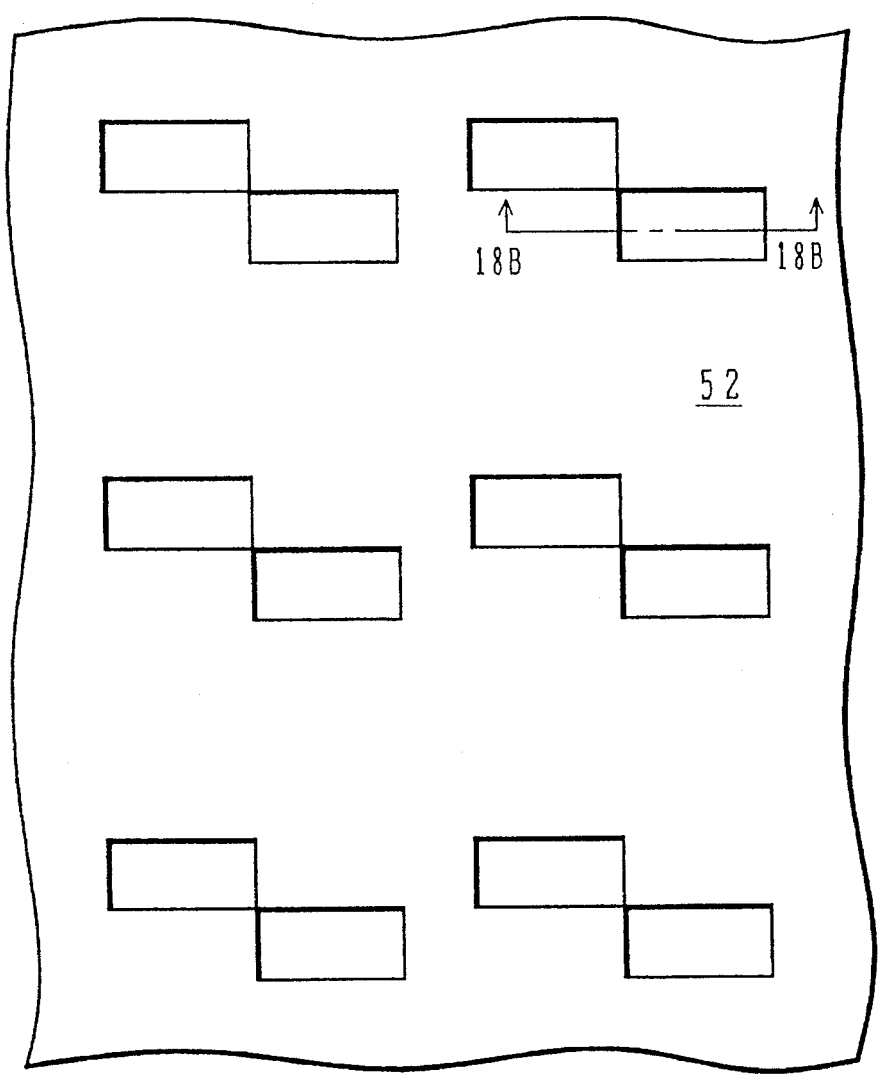
FIGS. 18A–18B are a plan view and a cross sectional view illustrating the semiconductor device manufacturing method according to a fourth embodiment of the present invention.
Figure 18B:
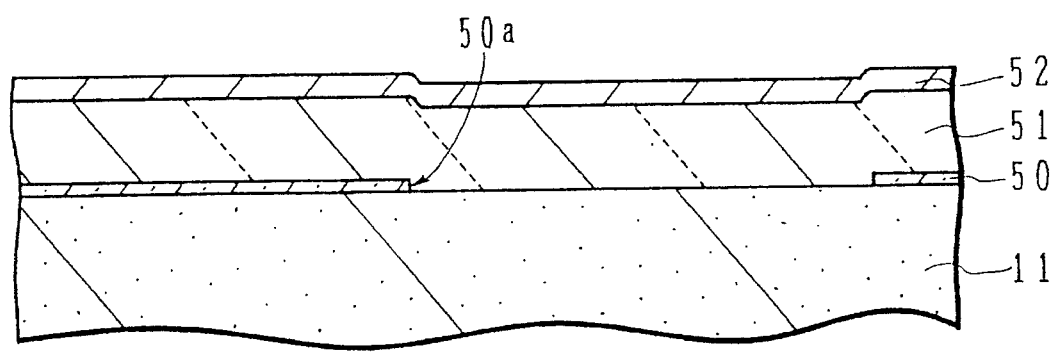

First, insulating films and metal film are formed as shown in FIGS. 18A and 18B. FIG. 18A is a plan view and FIG. 18B is a cross sectional view. On the surface of a non-doped semiinsulating GaAs substrate 11 grown by an LEC method and having the (0 0 1) plane, an insulating film 50 of AlN having a thickness of about 200 angstroms is deposited by sputtering under a ($N_2$+Ar) atmosphere using an A1 target at a substrate temperature of about 350° C.

A photoresist mask is formed on the insulating film 50 to wet-etch and pattern it using an etchant of, for example, H3PO4 at a temperature of 90° C., to form openings 50a.

Instead of A1N, other insulating materials may be used as the insulating film 50, such as $SiO_2$, $Si_3N_4$, and SiON. As shown in FIG. 18A. Openings 50a are formed so that each pair of two openings 50a are arranged on a diagonal line.

Another insulating film 51 made of an SiO$_2$ film and having a different etching characteristic is formed to a thickness of about 1500 angstroms. The insulating film 51 is deposited, for example, by a plasma CVD method by introducing a mixed gas of SiH$_4$, N$_2$O, and N$_2$ to the substrate at a temperature of about 300° C.

A metal layer 52 made of a WSi layer is formed on the insulating film 51 by Ar sputtering to a thickness of about 500 angstroms. Instead of WSi, other metals such as NiAl may be used so long as they can serve as a mask for selective epitaxial growth of semiconductor and allow the semiconductor to grow laterally on the surface of it.

Also as the materials of the insulating films 50 and 51, any pair may be selected from a group consisting of SiO$_2$, Si$_3$N$_4$, SiON, AlN, and the like so long as they serve as a mask for selective epitaxial growth of semiconductor and have different etching characteristics.

Next, a resist film is coated on the metal layer 52 and patterned to obtain a resist pattern. Using this resist pattern as an etching mask, the exposed metal layer 52 is selectively etched by an RIE method using an etchant of, for example, a mixed gas of CF$_4$+O$_2$.

Figure 19:
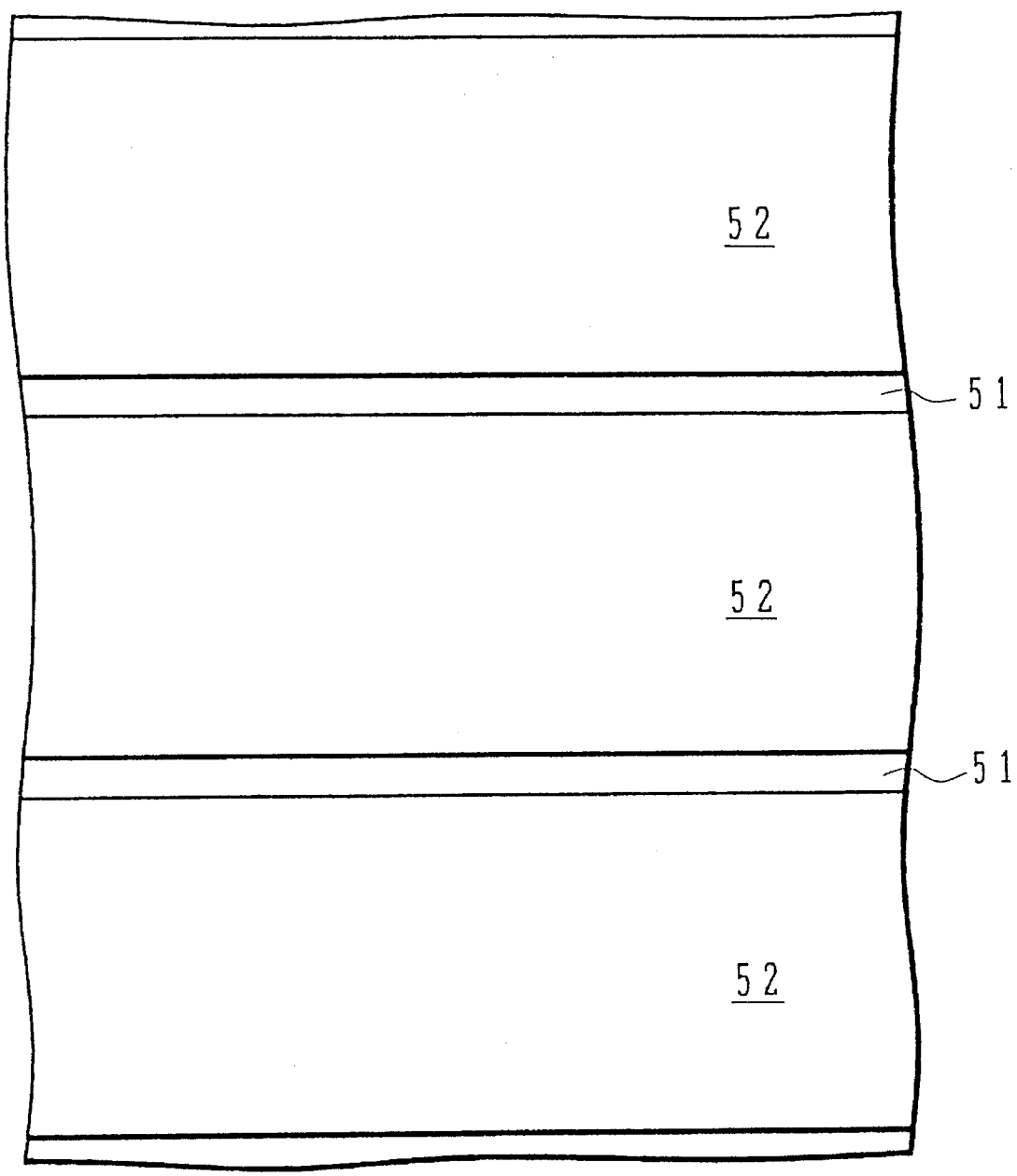
FIG. 19 is a plan view illustrating the semiconductor device manufacturing method of the fourth embodiment.

The underlie insulating film 51 is exposed at the regions where the metal layer 52 was etched, as shown in FIG. 19. The exposed insulating film 51 extend laterally in FIG. 19.

Figure 20A:
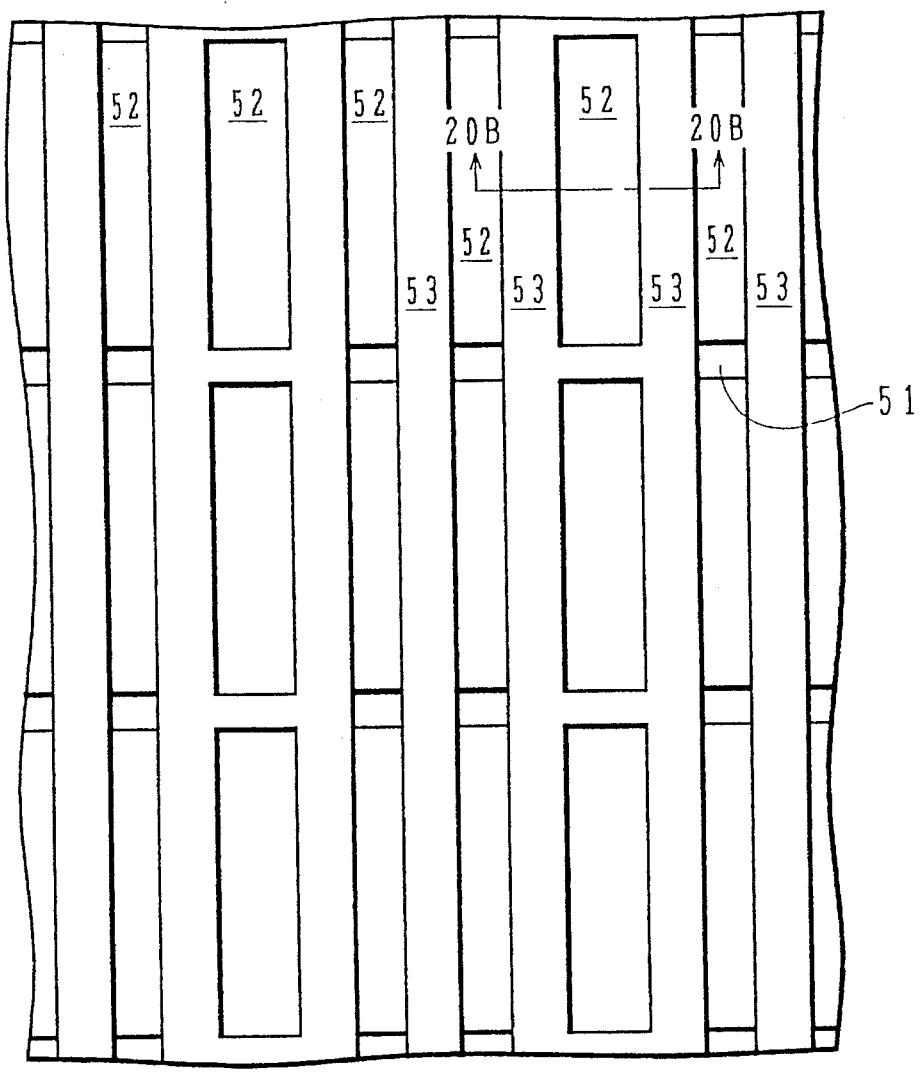
FIGS. 20A–20B, 21A–21B, 22A–22B, 23A–23B, 24A–24B, and 25A–25B are plan views and cross sectional views illustrating the semiconductor device manufacturing method of the fourth embodiment.
Figure 20B:
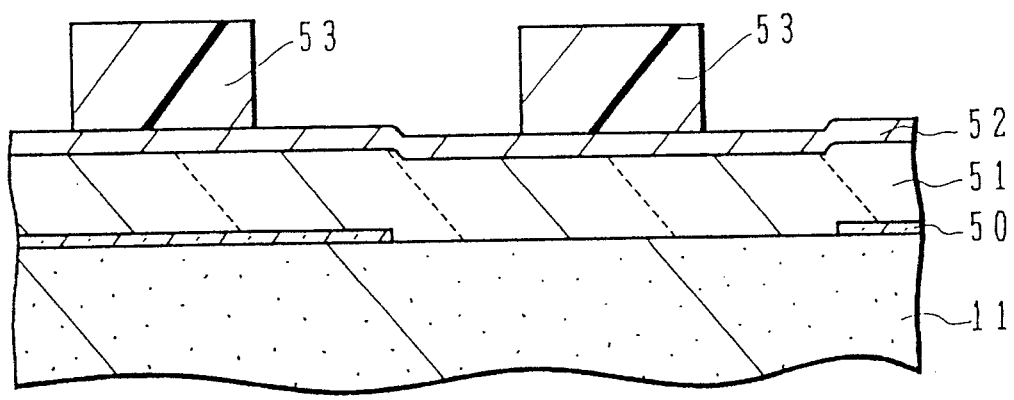

Next, as shown in FIGS. 20A and 20B, a resist film is again coated on the surface of the semiconductor substrate to form a resist pattern 53. FIG. 20A is a plan view and FIG. 20B is a cross sectional view. The resist pattern 53 includes vertically extending areas and horizontal coupling areas for coupling adjacent two vertically extending areas.

The resist pattern 53 also includes areas isolated from the consecutively coupled areas. Respective ones of the vertically extending two areas of the resist pattern 53 coupled by the horizontal coupling area, run at the middles of a pair of openings arranged on a diagonal line as shown in FIG. 18A.

Figure 21A:
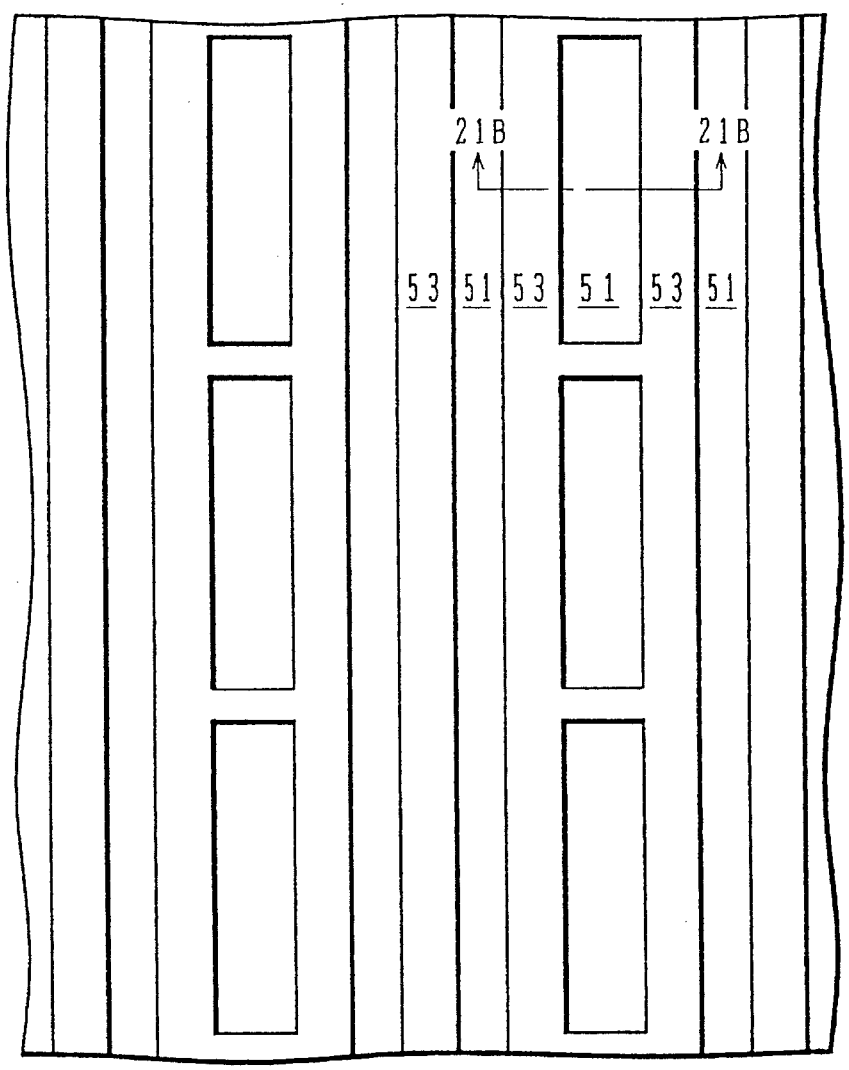
Figure 21B:
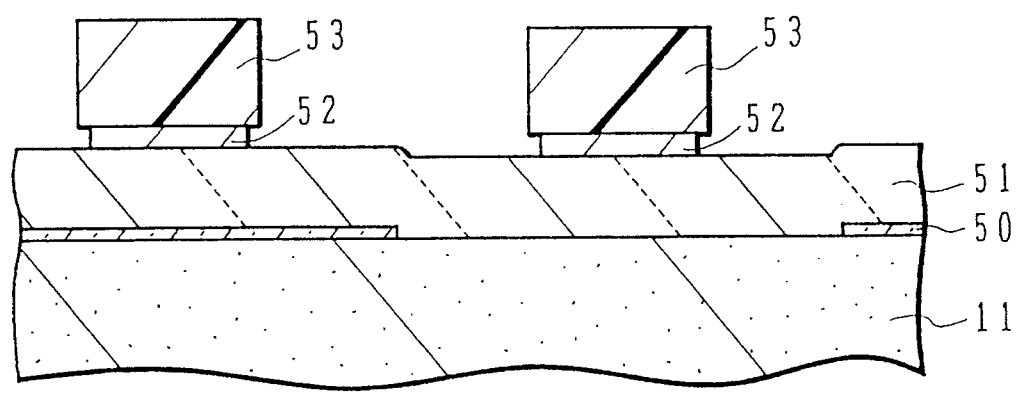

Using this resist pattern 53, etching is first performed as illustrated in FIGS. 21A and 21B. FIG. 21A is a plan view and FIG. 21B is a cross sectional view. Namely, the exposed metal layer 52 excepting the metal layer 52 just under the resist pattern 53 is etched by an RIE method using an etchant of a mixed gas of CF$_4$+O$_2$. The insulating film 51 is exposed at the regions where the metal layer 52 was etched.

Figure 22A:
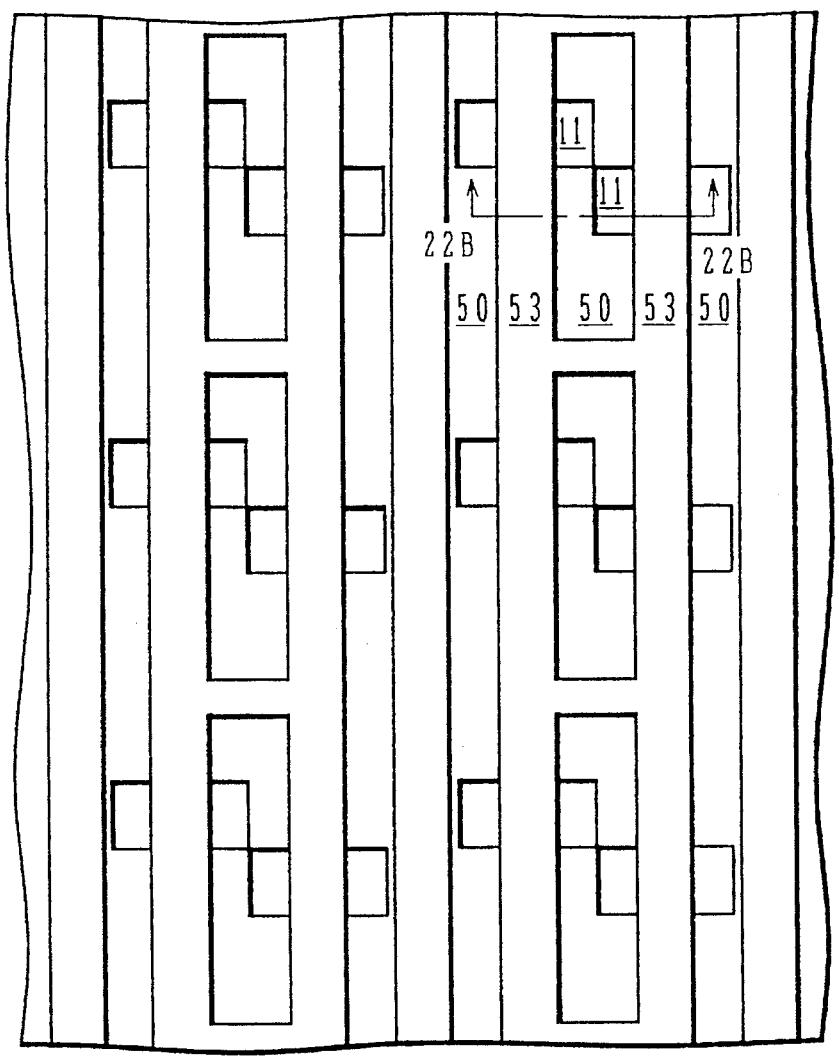
Figure 22B:
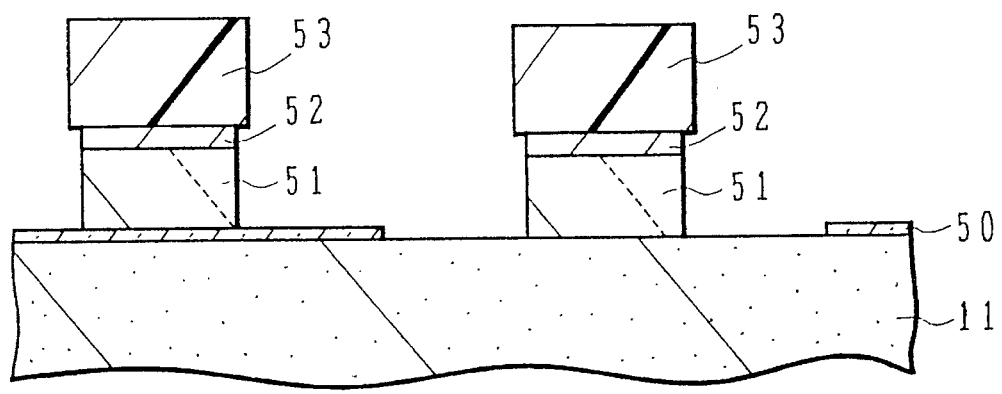

Next, as shown in FIGS. 22A and 22B, the exposed insulating film 51 is etched by an RIE method using an etchant of a mixed gas of CHF$_3$+CF$_4$. FIG. 22A is a plan view and FIG. 22B is a cross sectional view.

Next, wet etching is performed by using an etchant of a mixed solution of HF, NH$_4$, and H$_2$O to side-etch the insulating film and form an overhang on the bottom of the resist pattern 53 and an undercut below the overhang. Because the etching characteristics of the insulating films 50 and 51 are different, the insulating film 50 on the semiconductor surface is not etched but it is left on it.

In this state, at the region where the resist pattern 53 is not present, the insulating film 50 is exposed, or in the opening 50a of the insulating film 50 the surface of the semiconductor substrate 11 is exposed.

Next, a metal such as WSi and NiAl is Ar sputtered which metal functions as a selective growth mask and allows semiconductor to grow laterally on it. As a result, a metal layer 55 is evaporated on the resist pattern 53, and at the region where the resist pattern 53 is not present, on the semiconductor substrate 11 and insulating film 50.

Figure 23A:
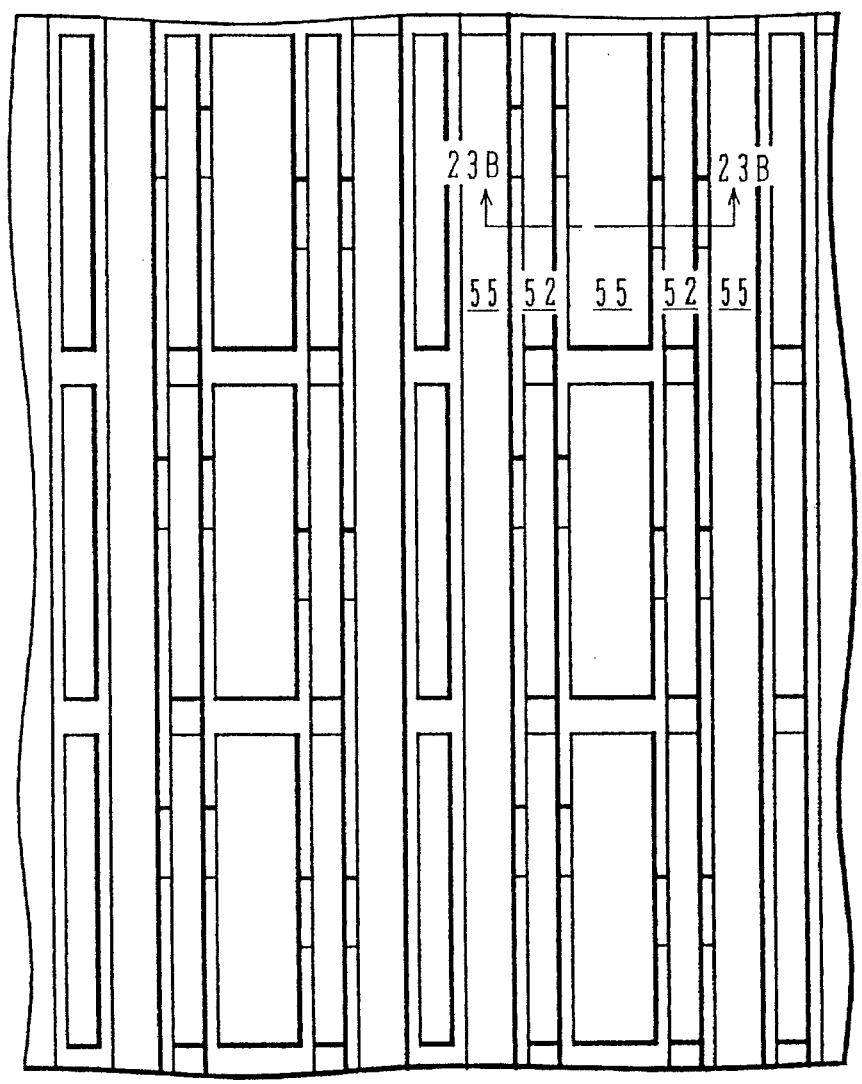
Figure 23B:
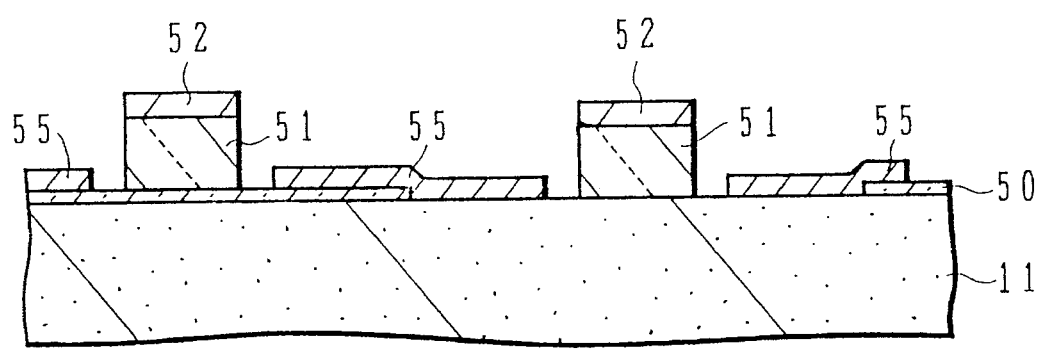

Thereafter, the resist pattern is removed to obtain the structure shown in FIGS. 23A and 23B. FIG. 23A is a plan view and FIG. 23B is a cross sectional view. In this state, because of the overhangs of the resist pattern 53, gaps are formed between the metal layer 52 formed on the insulating film 51 and the metal layer 55 formed on the surface of the semiconductor substrate 11, as shown in FIGS. 23A and 23B. The gaps expose the surface of the semiconductor substrate.

The material of the metal layers 52 and 55 is a metal which functions as a mask for selective epitaxial growth of semiconductor and allows the semiconductor to grow laterally on the metal surface. For example, WSi, NiAl, and other metals may be used.

Figure 24A:
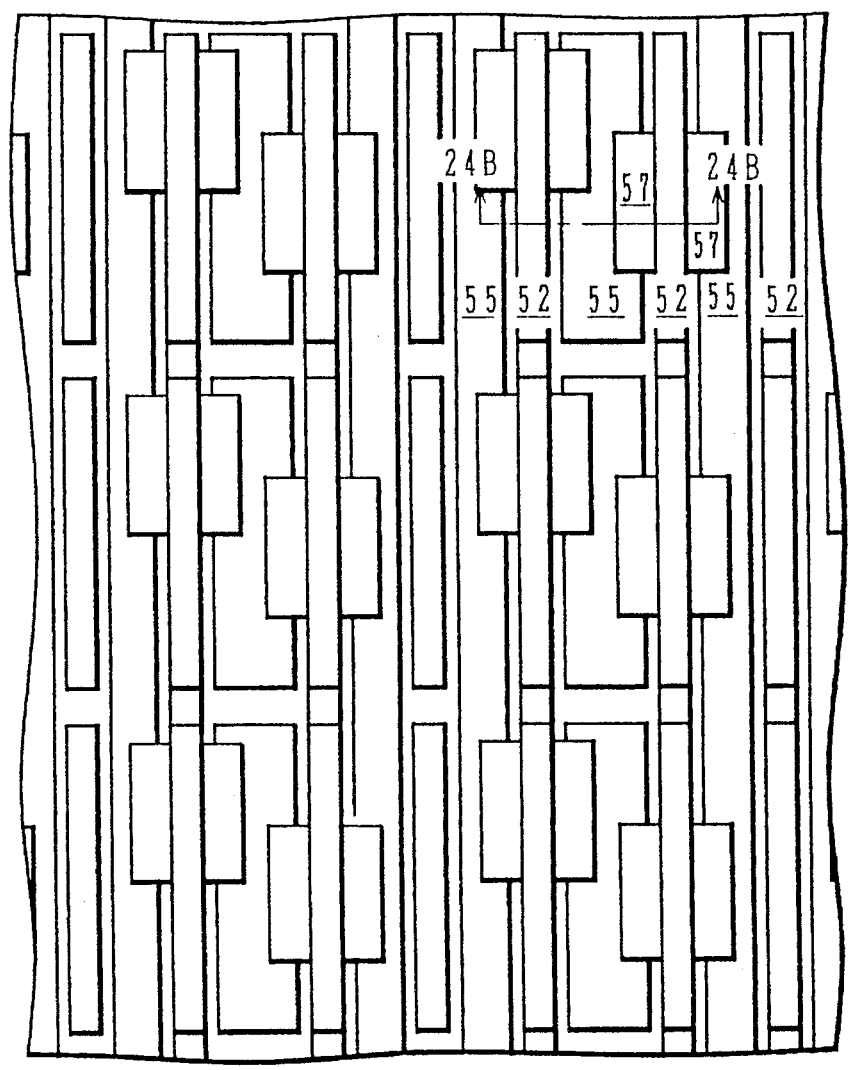
Figure 24B:
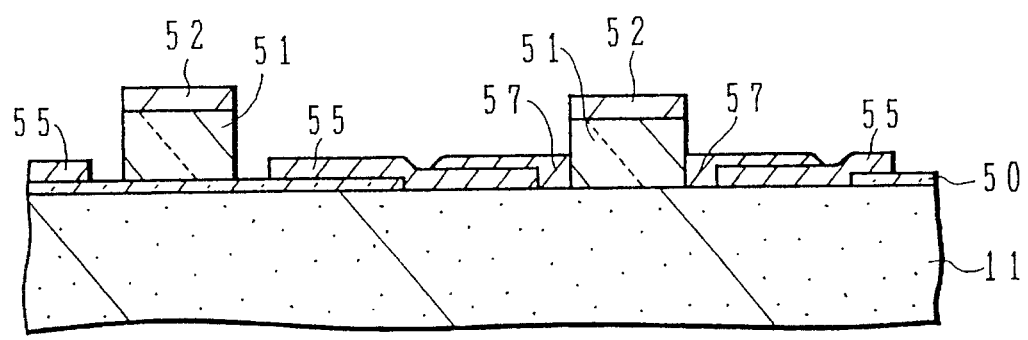

Next, as shown in FIGS. 24A and 24B, contact layers 57 are selectively grown on the surface of the semiconductor substrate 11 exposed by the gaps formed between the insulating film 51 and the metal layer 55. The contact layer 57 is made of, for example, an n$^+$-type GaAs layer containing an n-type impurity Se of about $8 * 10^{18}$cm$^{-13}$.

For example, the contact layer 57 can be grown by an ALE method by using as the source gases trimethylgallium (TMGa) and arsine (AsH$_3$) and introducing H$_2$Se at a concentration of about 5 ppm, at a growth temperature of 500° C., and under a growth pressure of 20 Torr.

The n$^+$-type GaAs contact layer 57 can be selectively grown only on the semiconductor surface exposed by the gaps, by repeating a number of times a gas sequence of, for example, H$_2$/TMGa/H$_2$/AsH$_3$=0.5 sec/3 sec/0.5 sec/ 5 sec.

When the n$^+$-type GaAs contact layer 57 exceeds the surface level of the metal layer 55, it also grows laterally in both the <1 1 0> and <1 −1 0> directions. As a result, as shown in FIGS. 24A and 24B, the contact layer 57 extends over the metal layer 55 and insulating layer 50.

After forming the contact layers 57, double-emitter type hetero bipolar transistors of an inverted structure are grown on the contact layers.

Figure 25A:
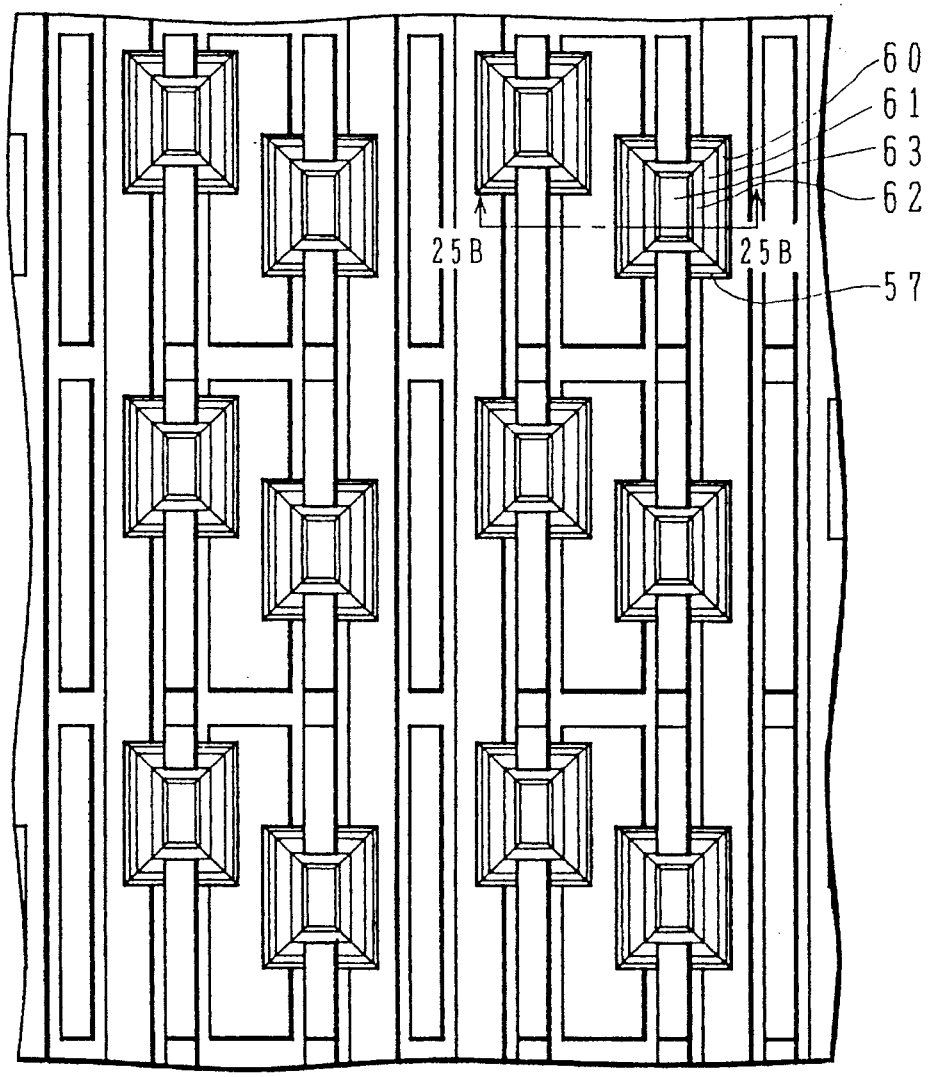
Figure 25B:
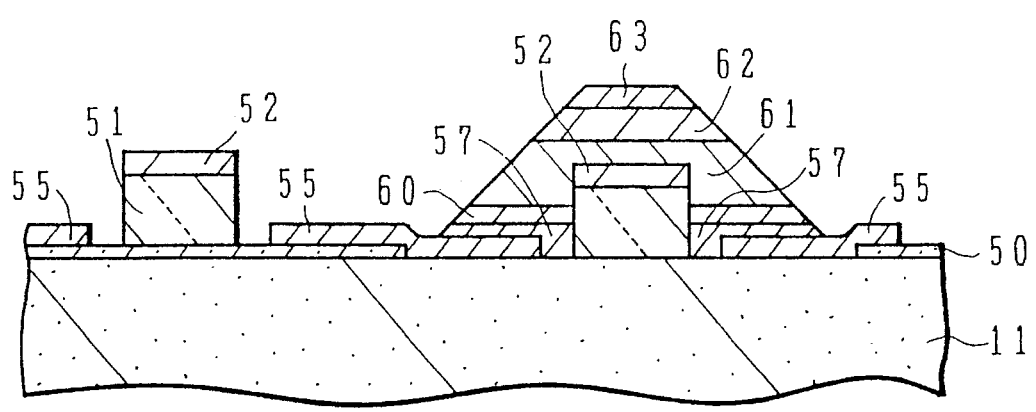

As shown in the plan view of FIG. 25A and in the cross sectional view of FIG. 25B, the emitter regions 60, base region 61, collector regions 62, and sub-collector region 63 are formed on the contact layer 57 by an MOVPE method.

For example, the emitter regions 60 are made of an n-type AlGaAs layer having a thickness of about 500 angstroms and an n-type impurity concentration of about $5 * 10^{17}$ cm$^{-3}$. The emitter regions 60 are epitaxially grown at a growth temperature of 650° C. and under a growth pressure of 76 Torr by introducing gases of TEGa, TMAl, AsH$_3$, H$_2$, and H$_2$Se.

The base region 61 is made of a p-type GaAs layer having a thickness of 1000 angstroms and a p-type impurity concentration of $1 * 10^{20}$ cm$^{-3}$. The base region 60 is grown at a growth temperature of 650° C. and under a growth pressure of 76 Torr by introducing gases of TEGa, AsH$_3$, H$_2$, and CCl$_4$.

As the base regions 62 grow higher than the surface level of the insulating film 51, they also grow laterally on the surface of the metal layer 52 to become a single integral base region 62.

The collector region 62 is made of an n-type GaAs layer having a thickness of about 1000 angstroms and an n-type impurity concentration of $5 * 10^{16}$ cm$^{-3}$. The collector region 62 is grown at a growth temperature of 650° C. and under a growth pressure of 76 Torr by introducing gases of TEGa, AsH$_3$, H$_2$, and H$_2$Se.

The sub-collector region 63 is made of an n$^+$-type GaAs layer having a thickness of about 1000 angstroms and an n-type impurity concentration of $8 * 10^{18}$ cm$^{-3}$. The sub-collector region 63 is grown at a growth temperature of 650° C. and under a growth pressure of 76 Torr by introducing gases of TEGa, AsH$_3$, H$_2$, and H$_2$Se.

Figure 26:
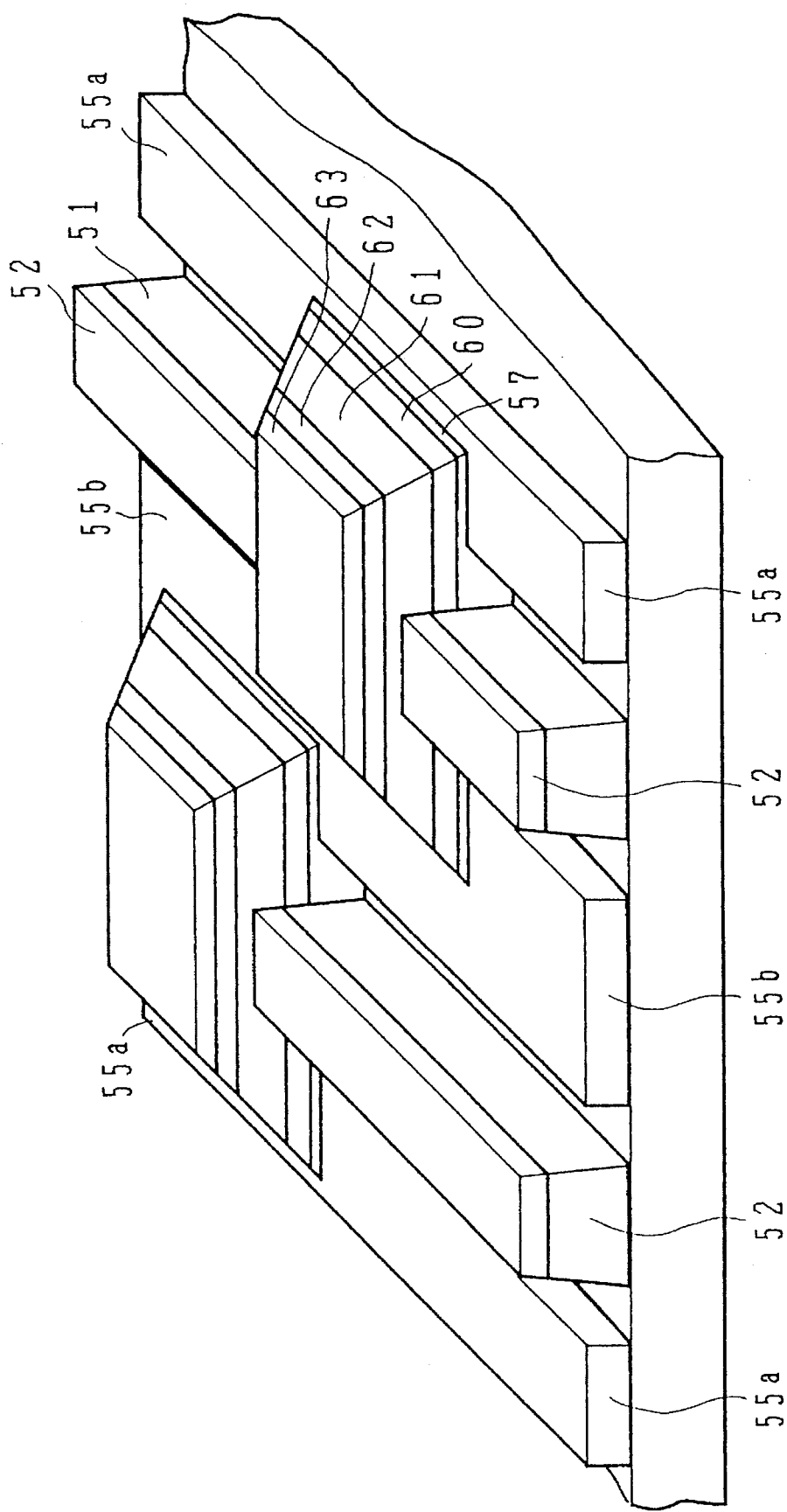
FIG. 26 is a perspective view showing the outline of the structure of the semiconductor device at the process shown in FIGS. 25A and 25B.

These grown layers have the (1 1 1) A planes in the <1 1 0> direction and the (1 1 1) B planes in the <1 −1 0> direction, forming a pyramid structure. FIG. 26 is a perspective view showing the outline of the semiconductor laminated structure at this stage.

An inverted type HBT is formed riding on the insulating film 51 and metal film 52, to constitute a double-emitter HBT. In FIG. 26, two double-emitter HBT are shown. One emitter of the double-emitter HBT is connected to the metal layer 55a, and the other is connected to the metal layer 55b to which one emitter of an adjacent double-emitter HBT is connected in common. The metal layer 52 on the insulating film 51 functions as the base electrode.

Figure 27A:
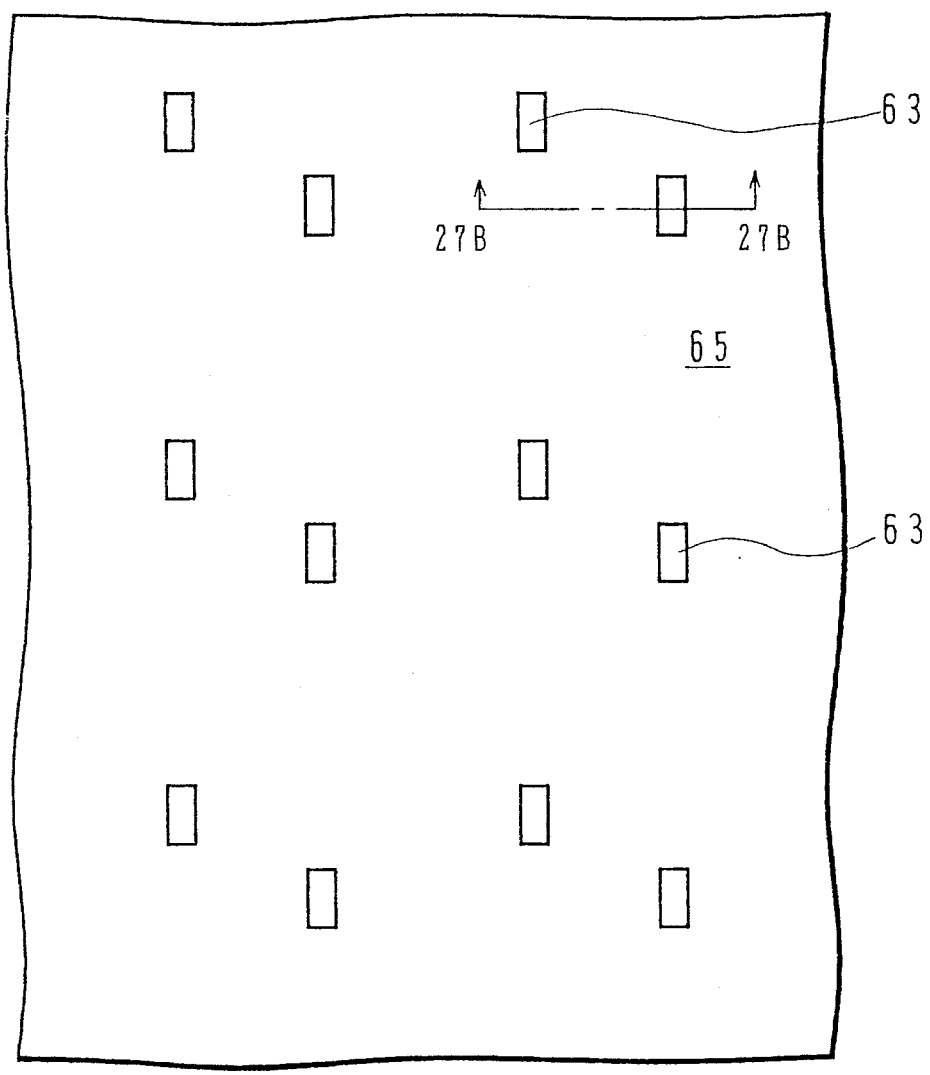
FIGS. 27A–27B, 28A–28B, and 29A–29B are plan views and cross sectional views illustrating the semiconductor device manufacturing method of the fourth embodiment.
Figure 27B:
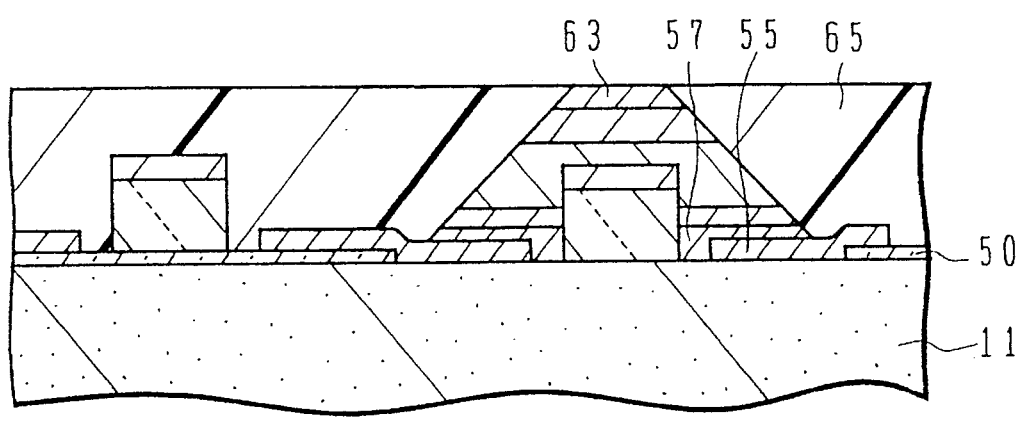

Next, as shown in FIGS. 27A and 27B, polyimide is coated on the semiconductor substrate surface to form a polyimide region 65 which exposes only the surfaces of the sub-collector regions 63 and fills the other areas with polyimide. FIG. 27A is a plan view and FIG. 27B is a cross sectional view. The polyimide region 65 flattens the surface of the semiconductor structure.

Figure 28A:
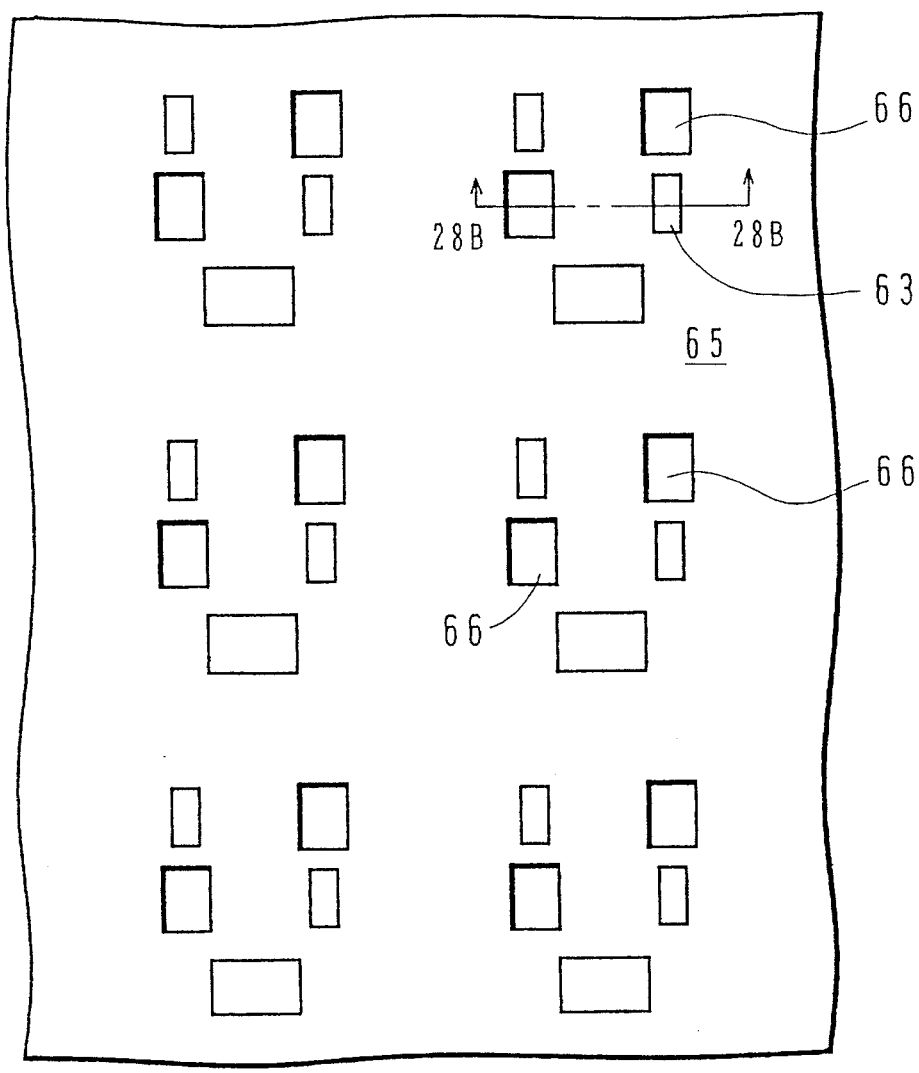
Figure 28B:
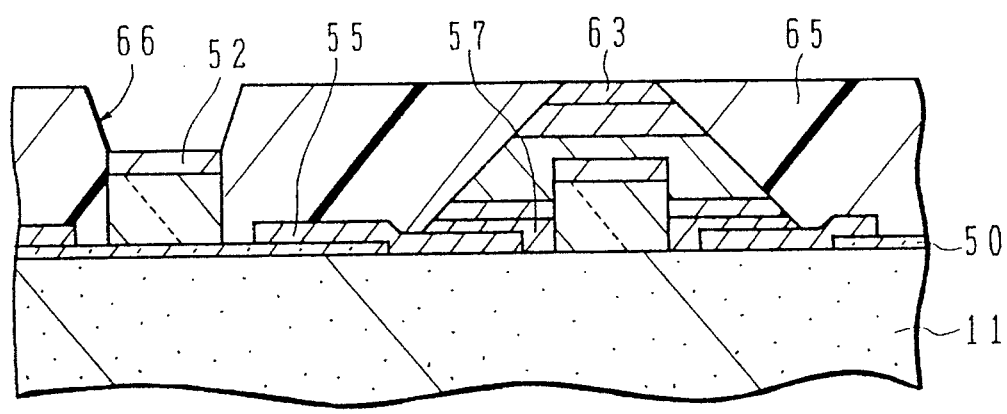

Next, as shown in FIGS. 28A and 28B, contact holes to the metal layer 52 as the base electrodes are formed. FIG. 28A is a plan view and FIG. 28B is a cross sectional view. In forming contact holes, a resist film is deposited on the semiconductor substrate surface and a resist pattern is formed having openings at the contact hole areas.

Next, the polyimide region 65 is selectively etched by an RIE method using an etching gas of CHF$_3$+CF$_4$ to form contact holes 66 exposing the surface of the metal layer 52. Thereafter, the resist pattern is removed to obtain the structure shown in FIGS. 28A and 28B.

Figure 29A:
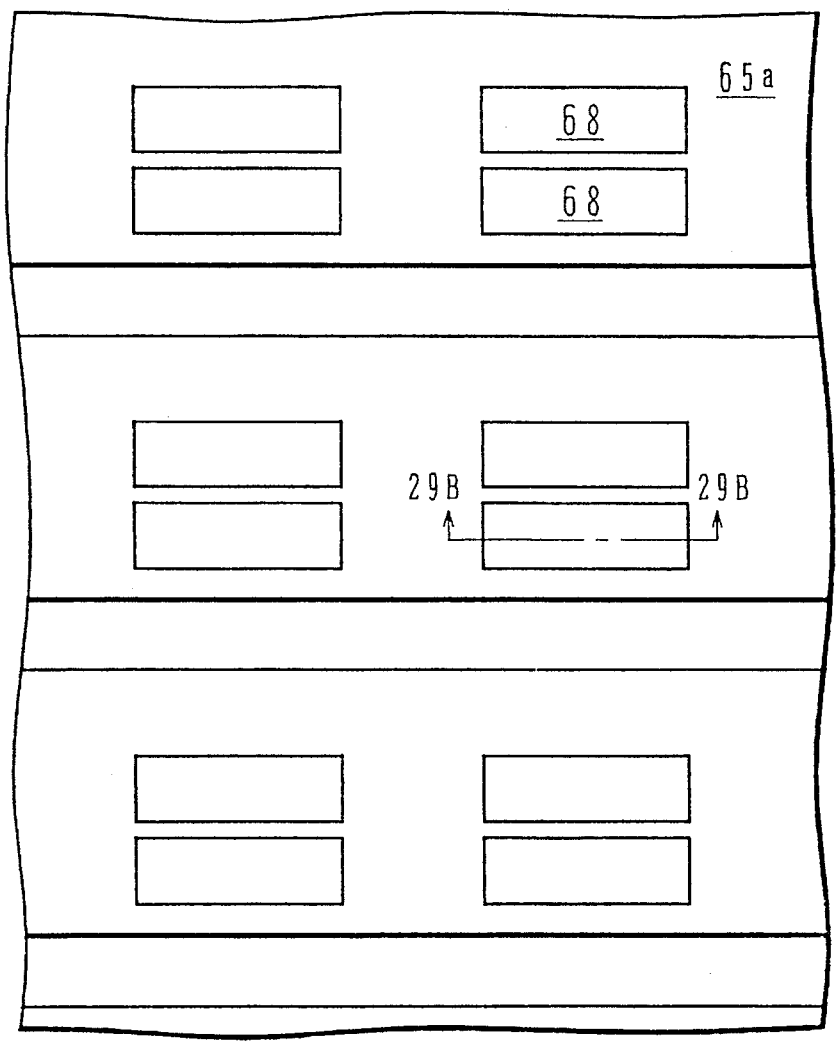
Figure 29B:
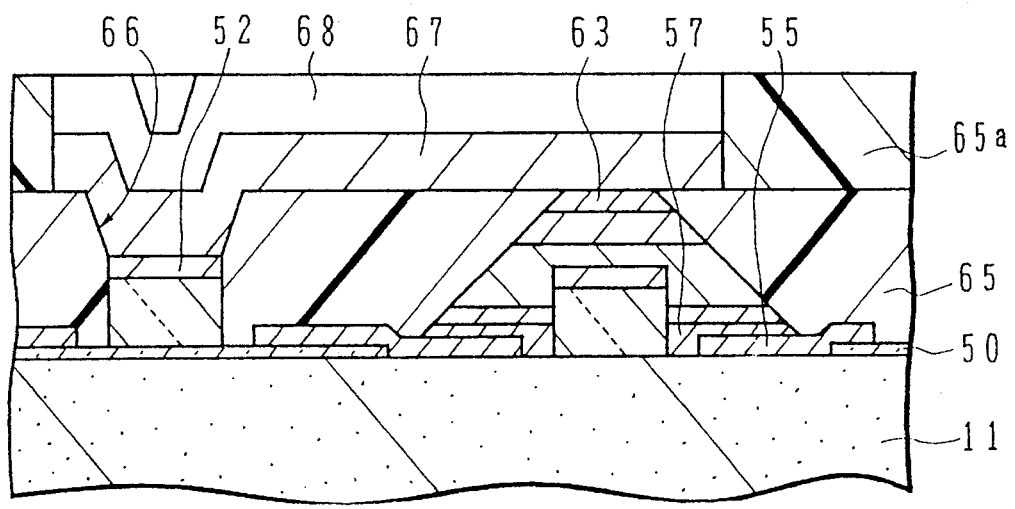

Next, a resist layer is again coated on the semiconductor substrate surface to form a resist pattern removing only the areas where a wiring layer is formed. Next, as shown in FIGS. 29A and 29B, a metal layer 67, for example, AuGe/Au (thickness 200/2000 angstroms) is vapor-deposited, and then a resistance layer 68, for example, WSiN is sputtered to a thickness of about 2000 angstroms. FIG. 29A is a plan view and FIG. 29B is a cross sectional view.

Other materials may be used for these metal layer and resistance layer so long as they can provide a good ohmic contact to the semiconductor layer and a necessary resistivity.

After forming the metal layer 67 and resistance layer 68, the resist pattern is removed to lift off the metal layer 67 and resistance layer 68 so that the laminated structure of the metal layer 67 and resistance layer 68 are left at the desired regions. Thereafter, polyimide is again coated to form a polyimide region 65a covering the metal layer 67 and resistance layer 68.

Figure 30:
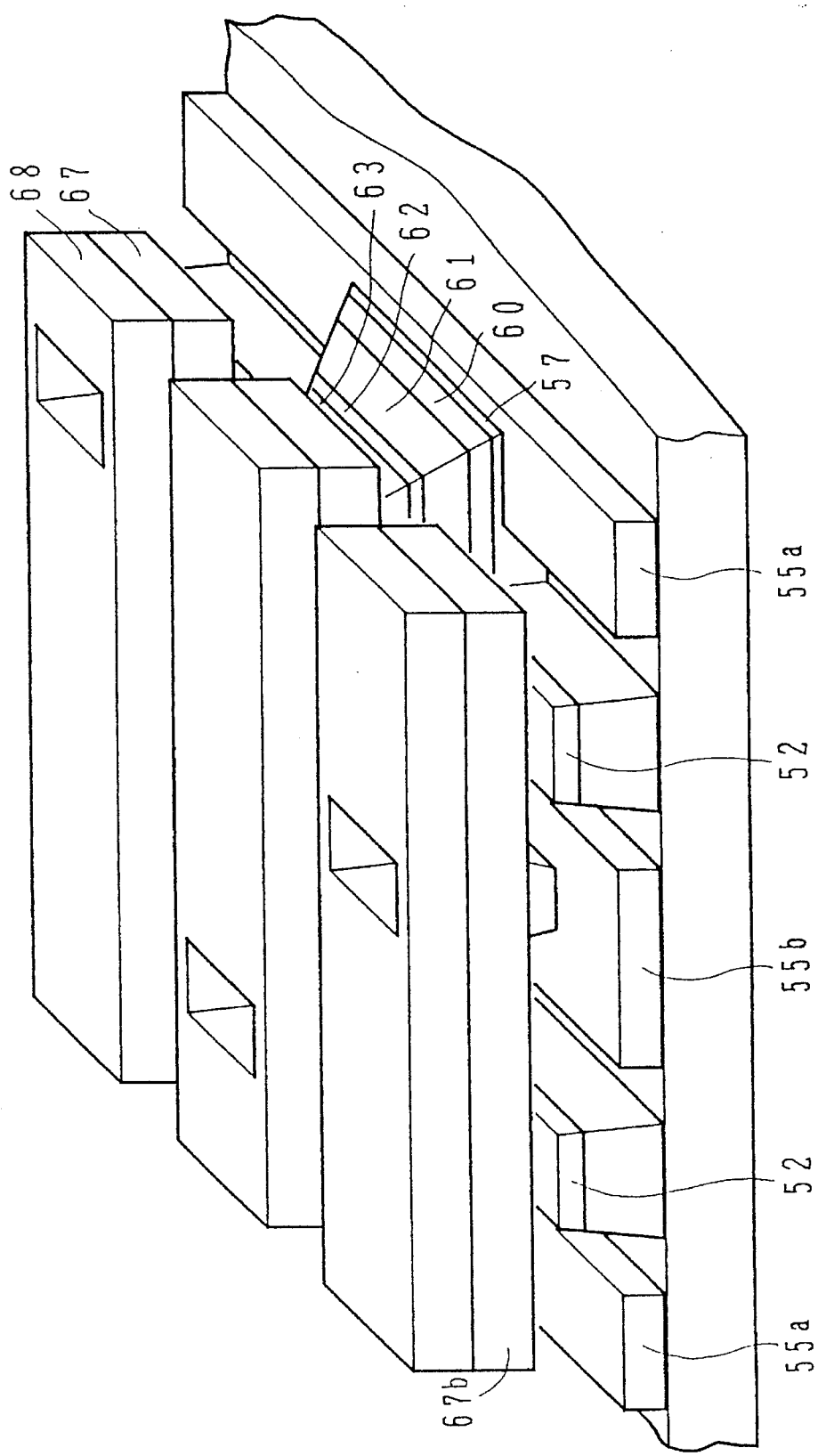
FIG. 30 is a perspective view showing the outline of the structure of the semiconductor device at the process shown in FIGS. 29A and 29B.

FIG. 30 is a perspective view showing the outline of the structure with the polyimide regions 65 and 65a being omitted at the stage shown in FIGS. 29A and 29B. The wiring layer connecting the collector region extends crossing the wiring layer connecting the emitter region. The central metal layer 55b as the word line is connected upward to the metal layer 67b formed on the polyimide region 65.

Figure 31A:
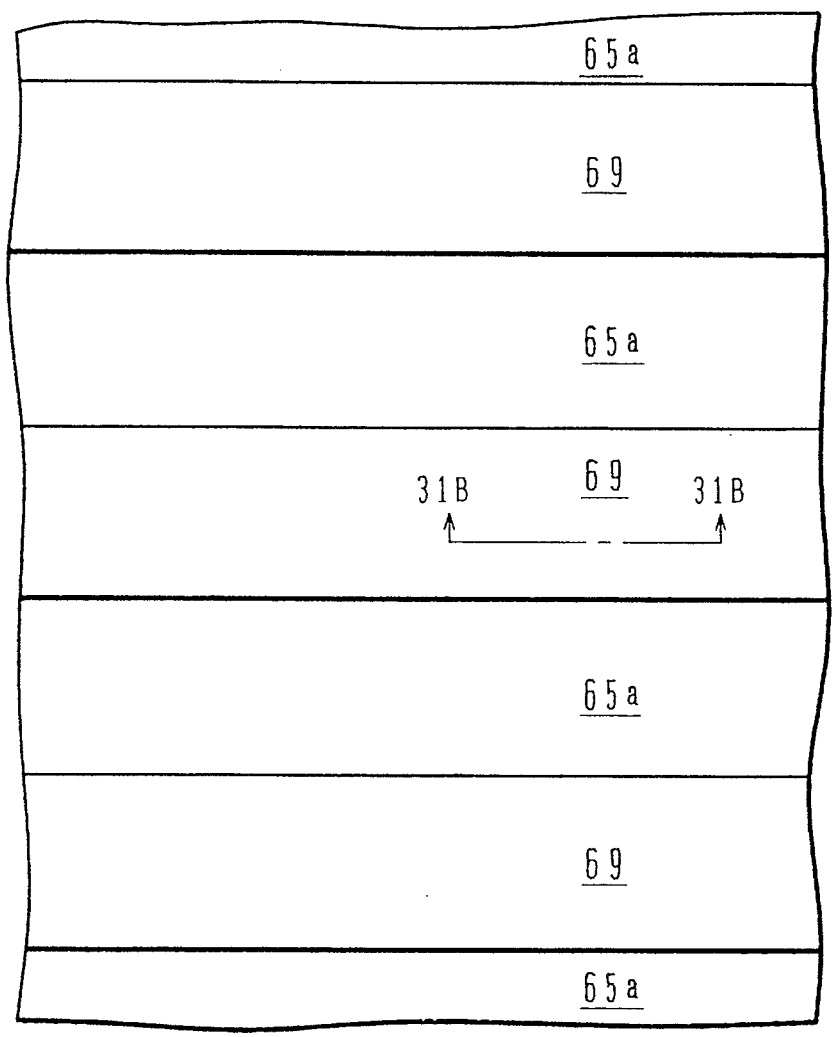
FIGS. 31A–31B, and 32A–32B are a plan view, a cross sectional view, a perspective view and a circuit diagram illustrating the semiconductor device manufacturing method of the fourth embodiment.
Figure 31B:
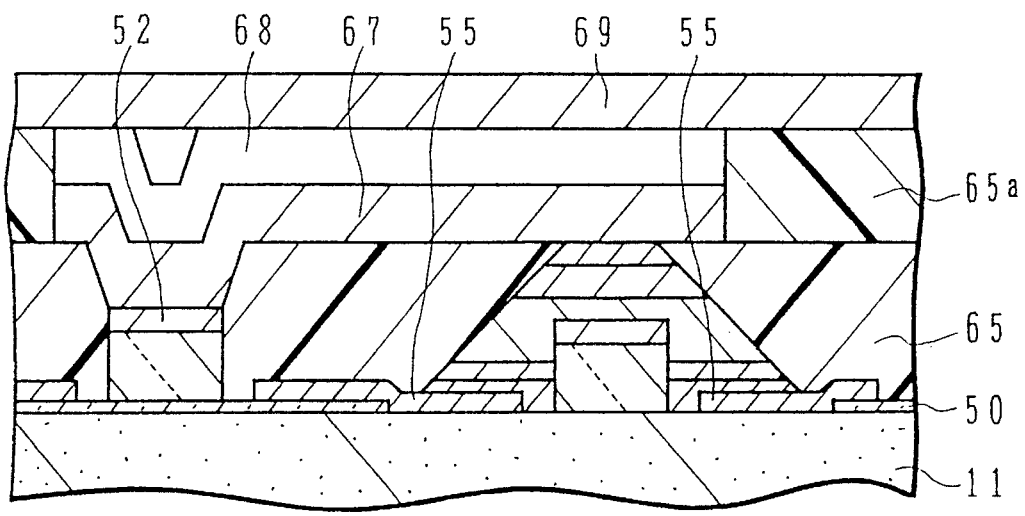
Figure 32A:
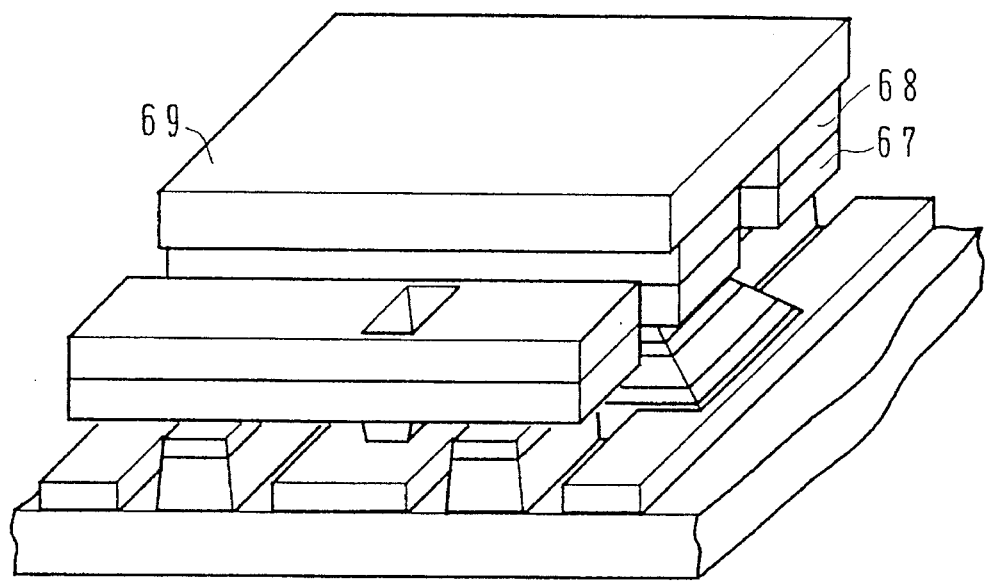

As shown in FIGS. 31A and 31B, a metal layer is formed on the semiconductor surface and patterned to obtain a power source wiring. FIG. 31A is a plan view and FIG. 31B is a cross sectional view.

Specifically, a metal layer such as AuGe/Au (thickness 200/2000 angstroms) is vapor-deposited. Other metals may also be used so long as they provide a good ohmic contact to semiconductor. Then, a resist layer is formed on the metal layer and patterned into a desired wiring shape.

After patterning the resist layer, the underlie metal layer is selectively etched by Ar ion milling to obtain the metal layer 69 forming the power source wiring. The resist layer is removed thereafter.

Figure 32B:
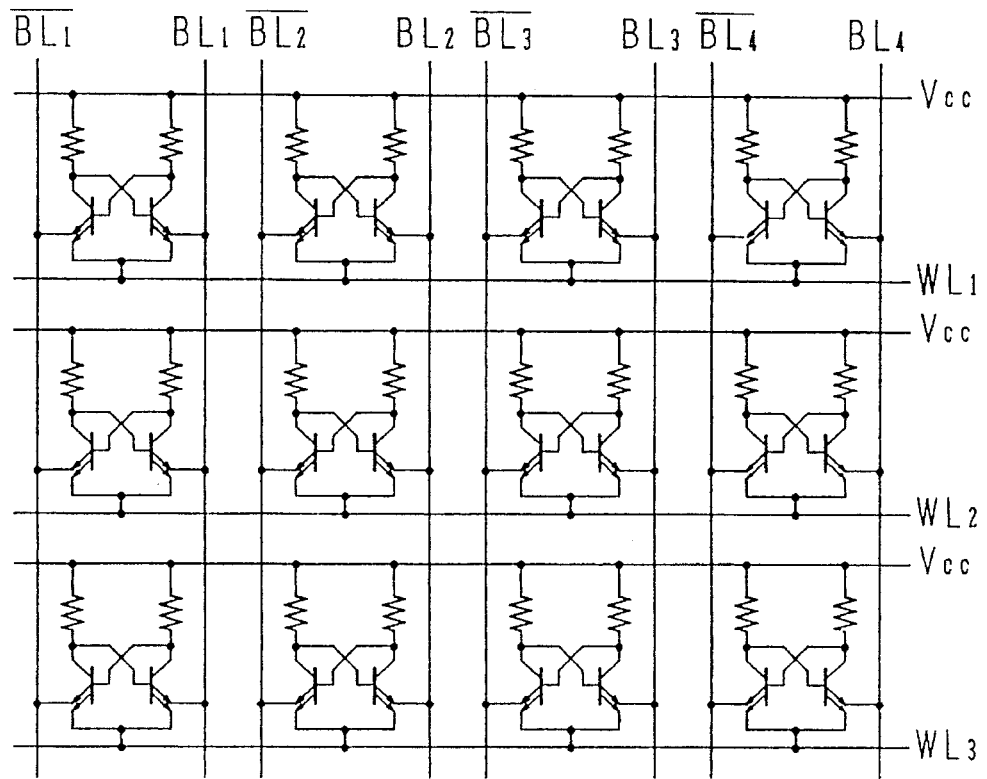

The outline of the structure of the semiconductor device obtained is shown in FIGS. 32A as a perspective view, with the polyimide regions being omitted. FIG. 32B is an equivalent circuit of the semiconductor device shown in FIG. 32A. The metal layer 69 as the power source wiring is connected via the underlie resistance layer 68 to the collector wiring layer 67. A double-emitter structure of inverted configuration is formed under each collector.

The equivalent circuit shown in FIG. 32B is a memory circuit using double-emitter HBTs. A memory cell is connected at each cross point of a matrix formed by bit lines BLs and word lines WLs.

The present invention is not limited only to the embodiments described above. For example, the insulating regions for separating the semiconductor laminated structures formed on the surface of a semiconductor substrate may take various shapes.

The wiring layer has been formed by depositing a metal. If metal such as NiSi and CoSi on Si, and AlNi on GaAs, capable of being epitaxially grown, is used, a need of a fine process is further alleviated. Various types of semiconductor materials can be used as desired.

Semiconductor elements formed in the above manner may be connected by a desired method. It is apparent that various modifications, improvements, and combinations may be made easily by those skilled in the art from the contents of the disclosure.

We claim:

1. A semiconductor device comprising:

a single crystal semiconductor substrate;

a first insulating region formed on said single crystal semiconductor substrate;

an opening defining member for defining a pair of openings, said pair of openings exposing the surface of said single crystal semiconductor substrate on both the sides of said first insulating region, said opening defining member having a function of regulating the growth of semiconductor crystal and having a pair of conductive regions at least near said pair of openings;

a pair of first semiconductor single crystal structures separated from each other, said pair of first semiconductor single crystal structures contacting the surface of said single crystal semiconductor substrate in said pair of openings, extending on the surface of said opening defining member, and being electrically connected to said pair of first conductive regions;

a second conductive region of single crystal material continuously formed on said pair of first semiconductor single crystal structures; and a second semiconductor single crystal structure formed on said second conductive region.

2. A semiconductor device according to claim 1, wherein said pair of first semiconductor single crystal structures has a lateral shape regulated by said first insulating region.

3. A semiconductor device according to claim 2, wherein said first insulating region has a surface level higher than the surface level of said pair of first semiconductor single crystal structures.

4. A semiconductor device according to claim 1, wherein said opening defining member includes a pair of second insulating regions formed on said single crystal semiconductor substrate and said pair of first conductive regions disposed on said pair of second insulating regions.

5. A semiconductor device according to claim 1, further comprising a third conductive region formed on said second semiconductor single crystal structure.

6. A semiconductor device according to claim 1, wherein said first semiconductor single crystal structure is a resonance tunnel diode structure.

7. A semiconductor device according to claim 6, wherein said second semiconductor single crystal structure is a tunnel barrier diode structure, and constitutes an inverted type resonance hot electron transistor together with said first semiconductor single crystal structures and said second conductive region.

8. A semiconductor device according to claim 1, wherein said first semiconductor single crystal structure is an emitter structure of a bipolar transistor and said second semiconductor single crystal structure is a collector structure of a bipolar transistor, to constitute an inverted type bipolar transistor together with said second conductive region.

9. A semiconductor device according to claim 1, wherein said first conductive region is a metal region contacting the surface of said semiconductor substrate.

10. A semiconductor device according to claim 1, further comprising a fourth conductive region formed on said first insulating region, said fourth conductive region having a function of regulating the growth of semiconductor crystal, wherein said second conductive region is electrically connected to said fourth conductive region.

11. A semiconductor device according to claim 1, wherein said first semiconductor single crystal structure, said second conductive region, and said second semiconductor single crystal structure, each have a tapered side surface.

12. A semiconductor device according to claim 11, wherein said tapered side surface forms a normal mesa plane.

13. A semiconductor device according to claim 11, wherein said tapered side surface includes a normal mesa plane and an inverted mesa plane.

14. A semiconductor device according to claim 13, wherein same structures as defined are disposed in an array on said semiconductor substrate, and said inverted mesa planes of adjacent structures are interconnected.

15. A semiconductor device according to claim 14, wherein said first conductive region extends on said semiconductor substrate in a first direction, and the connection of said inverted mesa planes extends in a second direction perpendicular to said first direction.

* * * * *